United States Patent
Kim et al.

(10) Patent No.: US 11,700,726 B2
(45) Date of Patent: Jul. 11, 2023

(54) SEMICONDUCTOR DEVICE

(71) Applicant: SAMSUNG ELECTRONICS CO., LTD., Suwon-si (KR)

(72) Inventors: Jin Sub Kim, Seoul (KR); Jun Kwan Kim, Seoul (KR); Woo Choel Noh, Hwaseong-si (KR); Kyoung-Hee Kim, Hwaseong-si (KR); Ik Soo Kim, Yongin-si (KR); Yong Jin Shin, Yongin-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/165,539

(22) Filed: Feb. 2, 2021

(65) Prior Publication Data

US 2021/0375877 A1 Dec. 2, 2021

(30) Foreign Application Priority Data

May 28, 2020 (KR) .......................... 10-2020-0064361

(51) Int. Cl.
*H10B 12/00* (2023.01)
*H01L 27/108* (2006.01)

(52) U.S. Cl.
CPC .. *H01L 27/10814* (2013.01); *H01L 27/10823* (2013.01); *H01L 27/10852* (2013.01); *H01L 27/10897* (2013.01)

(58) Field of Classification Search
None
See application file for complete search history.

(56) References Cited

U.S. PATENT DOCUMENTS

| | | | |
|---|---|---|---|
| 7,091,102 B2 | 8/2006 | Lim et al. | |
| 8,778,700 B2 | 7/2014 | Udayakumar et al. | |
| 8,841,195 B2 | 9/2014 | Sun et al. | |
| 8,946,800 B2 | 2/2015 | Kume et al. | |
| 9,093,460 B2 | 7/2015 | Kim et al. | |
| 10,483,265 B2 | 11/2019 | Lee et al. | |
| 10,559,569 B2* | 2/2020 | Jang | H01L 27/10814 |
| 2012/0064689 A1* | 3/2012 | Hirota | H01L 27/10814 |
| | | | 438/381 |
| 2014/0103491 A1* | 4/2014 | Kim | H01L 27/10894 |
| | | | 257/532 |
| 2016/0104763 A1* | 4/2016 | Choi | H01L 28/75 |
| | | | 257/532 |
| 2018/0175042 A1* | 6/2018 | Jang | H01L 21/32055 |
| 2019/0096920 A1* | 3/2019 | Zhou | H01L 27/1296 |
| 2019/0157214 A1* | 5/2019 | Kim | H01L 23/5226 |

FOREIGN PATENT DOCUMENTS

KR     20130128502 A     11/2013

* cited by examiner

*Primary Examiner* — Steven M Christopher
(74) *Attorney, Agent, or Firm* — Myers Bigel, P.A.

(57) ABSTRACT

A semiconductor device includes a lower electrode on a substrate, a capacitor dielectric film extending on the lower electrode along a side surface of the lower electrode that is perpendicular to the substrate, an upper electrode on the capacitor dielectric film, an interface layer including a hydrogen blocking film and a hydrogen bypass film on the upper electrode, the hydrogen blocking film including a conductive material, and a contact plug penetrating the interface layer and electrically connected to the upper electrode.

15 Claims, 18 Drawing Sheets

SEMICONDUCTOR DEVICE

CROSS-REFERENCE TO RELATED APPLICATIONS

This application claims priority under 35 U.S.C. § 119 to Korean Patent Application No. 10-2020-0064361, filed on May 28, 2020 in the Korean Intellectual Property Office, the disclosure of which is incorporated by reference herein in its entirety.

TECHNICAL FIELD

Embodiments of the present disclosure relate to a semiconductor device.

BACKGROUND

In recent years, with increasing capacity and higher integration of semiconductor elements, design rules related to geometric constraints on manufacturing processes of the semiconductor device have also decreased. Such a tendency for reduced geometric constraints is seen in the manufacture of memory semiconductor elements such as Dynamic Random Access Memory (DRAM) devices. In order for a DRAM device to operate, a certain level or more of capacitance is required for each cell.

An increase in capacitance increases an amount of charges stored in the capacitor to improve refresh characteristics of the semiconductor device. The improved refresh characteristics of the semiconductor device may improve the yield of the semiconductor device.

Further, it may be beneficial to control a leak current and improve a refresh time of the semiconductor device.

SUMMARY

Aspects of the present disclosure provide a semiconductor device capable of improving the performance and reliability of an element, by including a hydrogen blocking film and a hydrogen bypass film.

According to some embodiments of the present disclosure, a semiconductor device includes a lower electrode on a substrate, a capacitor dielectric film extending on the lower electrode along a side surface of the lower electrode that is perpendicular to the substrate, an upper electrode on the capacitor dielectric film and on the lower electrode, an interface layer including a hydrogen blocking film and a hydrogen bypass film on the upper electrode, the hydrogen blocking film including a conductive material, and a contact plug penetrating the interface layer and electrically connected to the upper electrode.

According to some embodiments of the present disclosure, a semiconductor device includes a substrate including a cell region and a cell peripheral region, a lower electrode on the cell region, a capacitor dielectric film extending on the lower electrode along a side surface of the lower electrode that is perpendicular to the substrate, an upper electrode on the capacitor dielectric film, an interface layer including a hydrogen blocking film and a hydrogen bypass film on the upper electrode, and a contact plug penetrating the interface layer and electrically connected to the upper electrode. The hydrogen bypass film is on the cell region and not disposed on the cell peripheral region of the substrate.

According to some embodiments of the present disclosure, a semiconductor device includes a gate trench in a substrate, a gate electrode in a portion of the gate trench, a storage contact on at least one side of the gate electrode and in contact with the substrate, a storage pad on the storage contact, a capacitor electrically connected to the storage pad, an interface layer including a hydrogen blocking film and a hydrogen bypass film on the capacitor, and a contact plug penetrating the interface layer and electrically connected to the capacitor. The hydrogen blocking film includes an insulating material, and the hydrogen bypass film includes a metal material.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
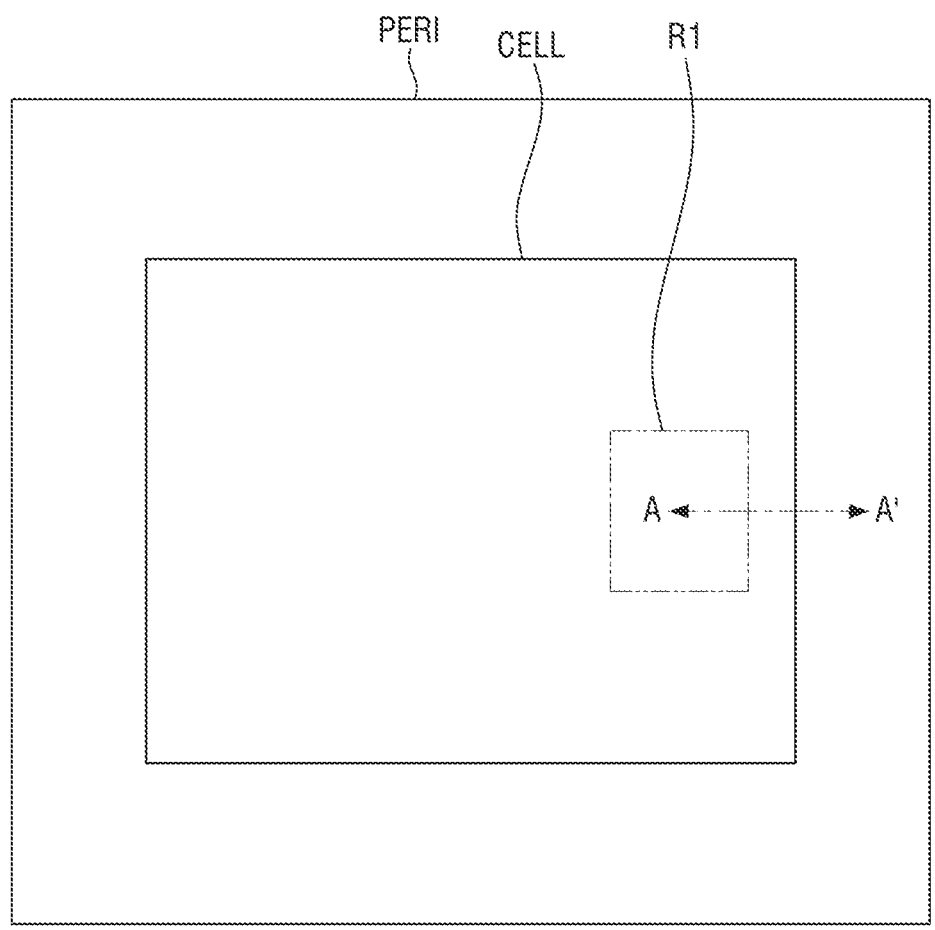
FIG. 1 is a layout diagram of a semiconductor device according to some embodiments.
Figure 1:
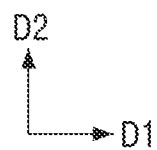
Figure 2:
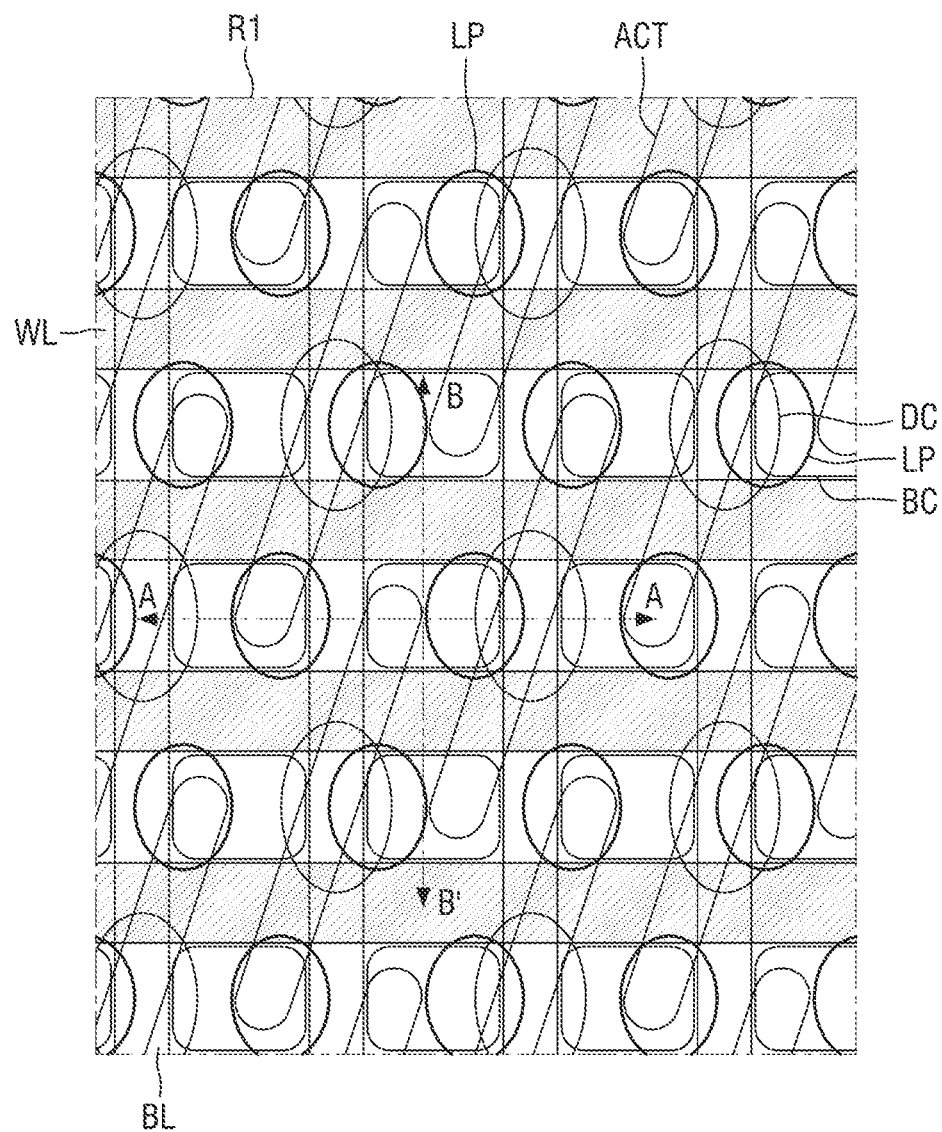
FIG. 2 is an enlarged view of a region R1 of FIG. 1.

FIG. 1 is a layout diagram of a semiconductor device according to some embodiments. FIG. 2 is an enlarged view of a region R1 of FIG. 1.

Although FIG. 1 shows an example layout diagram of a DRAM (Dynamic Random Access Memory) but the present disclosure is not limited thereto. For simplicity of illustration, FIG. 1 omits capacitor CAP from this view.

Referring to FIGS. 1 and 2, a semiconductor device according to some embodiments may include a cell region CELL, and a peripheral region PERI disposed around the cell region CELL.

The cell region CELL may include an active region ACT, a word line WL and a bit line BL. Semiconductor memory elements on a substrate may be formed in the cell region CELL.

The active region ACT may be defined by an element isolation film 103 formed in the substrate 100. The active region ACT may be disposed in a bar shape of a diagonal line or an oblique line, as the design rule of the semiconductor device decreases. The active region ACT may extend in a third direction D3 that is oblique with respect to a first direction D1 and a second direction D2.

On the active region ACT, a plurality of gate electrodes may be disposed across the active region ACT. The plurality of gate electrodes may extend in a second direction D2 to be parallel with each other. The plurality of gate electrodes may be, for example, a plurality of word lines WL.

The word lines WL may be disposed at intervals that are approximately equally spaced from one another. The width of the word lines WL or the interval between the word lines WL may be determined according to the design rules. The design rules are related to geometric constraints on manufacturing processes of the semiconductor device. At least two word lines WL may be disposed to cross one active region ACT. The diagonal or oblique arrangement of the active regions ACT allows the word line WL to have an angle of less than 90 degrees with the active region ACT.

A plurality of bit lines BL extending in a first direction D1 orthogonal to the word line WL may be disposed on the word line WL. The plurality of bit lines BL may extend to be parallel with each other.

The bit lines BL may be disposed at intervals that are approximately equally spaced from one another. The width of the bit lines BL or the interval between the bit lines BL may be determined according to the design rules.

A semiconductor device according to some embodiments may include various contact arrays formed on the active region ACT. Various contact arrangements may include, for example, a direct contact DC, a buried contact BC, a landing pad LP, and the like.

The direct contact DC may be disposed, for example, in a central portion of the active region ACT. The direct contact DC may be a contact that electrically connects the active region ACT to the bit line BL.

The buried contact BC may be disposed, for example, at both ends of the active region ACT. That is, the buried contact BC may be disposed symmetrically with the direct contact DC, and the buried contact BC and the direct contact DC may be disposed on a straight line along the first direction D1 and the second direction D2.

The buried contact BC may be disposed between two bit lines BL adjacent to each other among the plurality of bit lines BL. The buried contact BC may be a contact that connects the active region ACT to a lower electrode 210 of the capacitor of FIG. 5.

The landing pad LP may be disposed to partially overlap the buried contact BC, for example, to be adjacent to both ends of the active region ACT. The landing pad LP may be disposed in a zigzag form in the second direction D2. The landing pad LP may be disposed to overlap the same side portions of each bit line BL in the first direction D1.

The landing pad LP may be disposed between the active region ACT and the buried contact BC, or may be disposed between the buried contact BC and the lower electrode 210 of the capacitor. The landing pad LP may increase a contact area between the buried contact BC and the active region ACT, such that the contact resistance between the active region ACT and the lower electrode 210 of the capacitor may decrease accordingly.

The peripheral region PERI may be a region in which peripheral circuits for driving the semiconductor memory elements formed in the cell region CELL are disposed.

Figure 3:
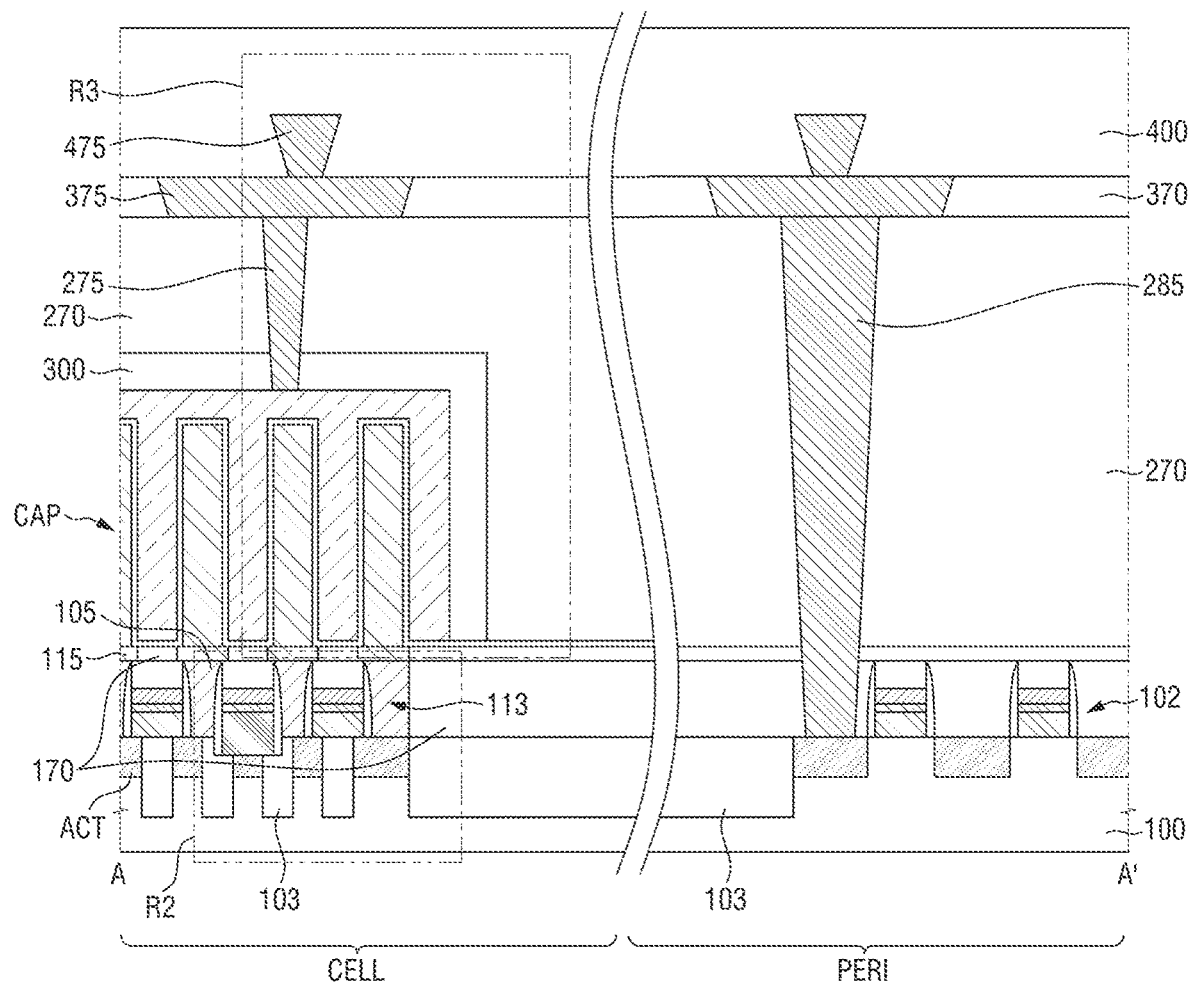
FIG. 3 is a cross-sectional view taken along a line A-A' of FIGS. 1 and 2.
Figure 4:
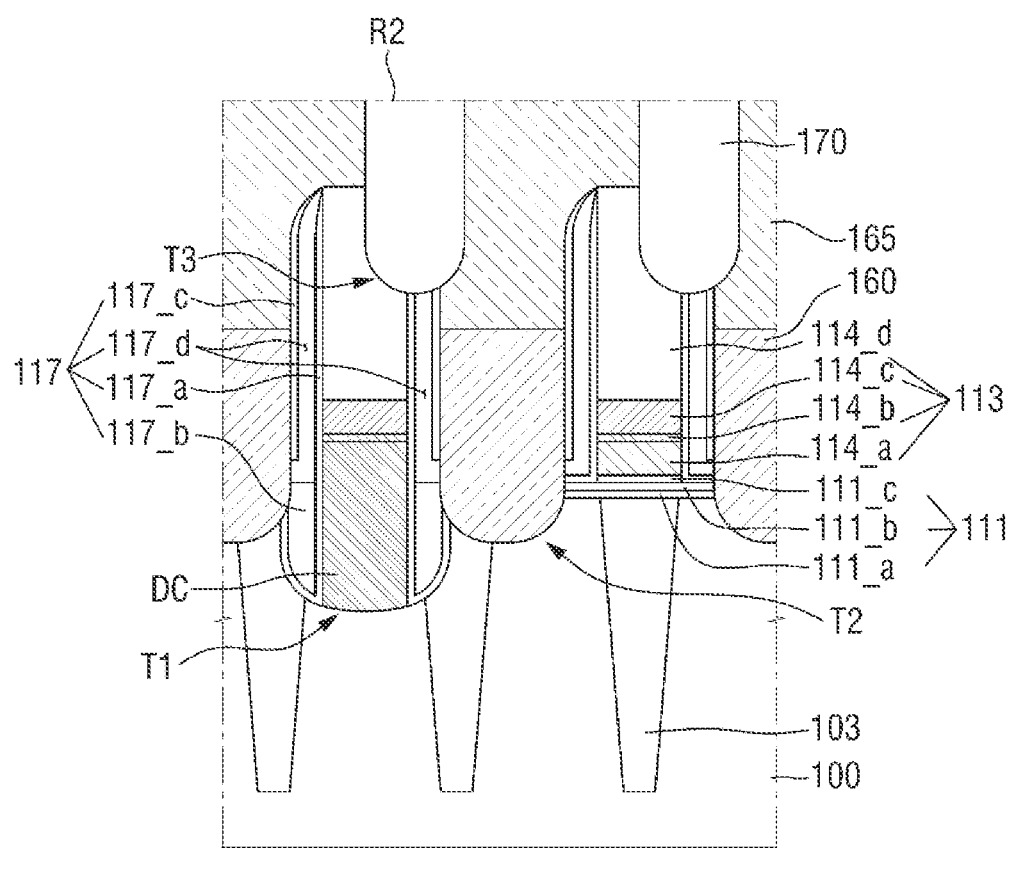
FIG. 4 is an enlarged view of a region R2 of FIG. 3.
Figure 4:
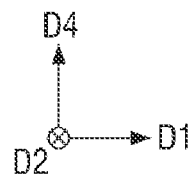
Figure 5:
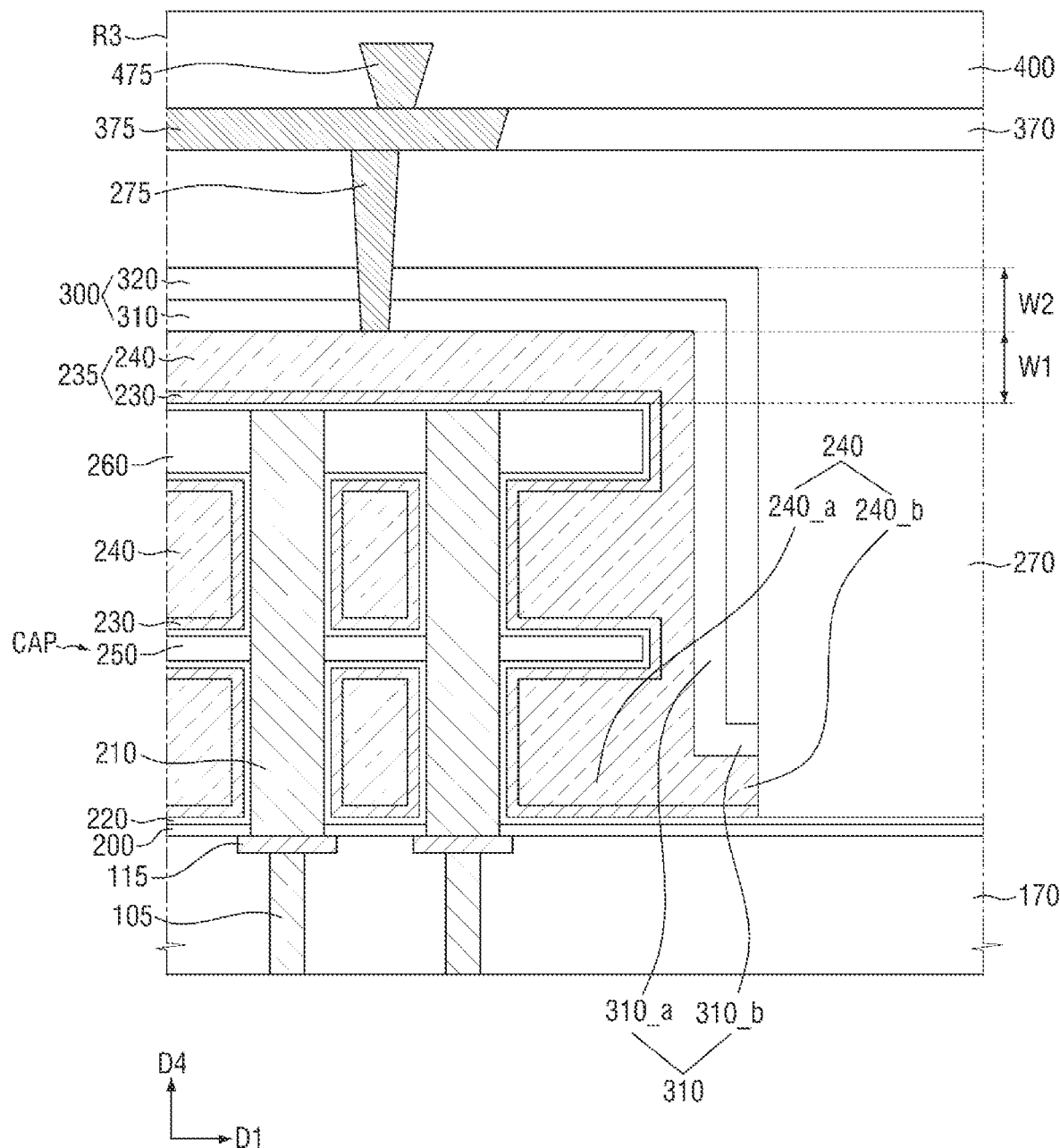
FIG. 5 is an enlarged view of a region R3 of FIG. 3.

FIG. 3 is a cross-sectional view taken along the line A-A' of FIGS. 1 and 2. FIG. 4 is an enlarged view of a region R2 of FIG. 3. FIG. 5 is an enlarged view of a region R3 of FIG. 3.

Referring to FIGS. 1 to 5, the semiconductor device, according to some embodiments, may include a cell region CELL and a peripheral region PERI on the substrate 100.

The cell region CELL may include a substrate 100, an element isolation film 103, a bit line structure 113, a storage contact 160 (also referred to as buried contact 160), a landing pad 165, a first interlayer insulating film 170, a capacitor CAP, a second interlayer insulating film 270, a first contact plug 275, an interface layer 300, a third interlayer insulating film 370, a first wiring layer 375, a passivation layer 400, and a second wiring layer 475.

The substrate 100 may be bulk silicon or a SOI (silicon-on-insulator). Alternatively, the substrate 100 may be a silicon substrate, or may include other material, for example, but is not limited to, silicon germanium, SGOI (silicon germanium on insulator), indium antimonide, lead tellurium compound, indium arsenide, phosphide indium, gallium arsenide or gallium antimonide. In the following non-limiting example explanation, the substrate 100 will be explained as a silicon substrate.

The element isolation film 103 may be formed in the substrate 100. The element isolation film 103 may have an STI (shallow trench isolation) structure having excellent element isolation characteristics. The element isolation film 103 may define an active region ACT on the substrate 100.

The active region ACT defined by the element isolation film 103 may have a long island shape including a short axis and a long axis, as shown in FIG. 2. The active region ACT may have a diagonal form to have an angle of less than 90 degrees with respect to the word line WL formed in the element isolation film 103. In addition, the active region ACT may have a diagonal form to have an angle of less than 90 degrees with respect to the bit line BL formed on the element isolation film 103.

The bit line structure 113 may be formed on the substrate 100, the element isolation film 103 and the insulating pattern 111. The bit line structure 113 may correspond to a bit line BL.

Referring to FIG. 4, the bit line structure 113 includes first to third conductive films 114_a, 114_b and 114_c and a first capping film 114_d sequentially stacked on the substrate 100.

Although the first to third conductive films 114_a, 114_b and 114_c may be a single film, they may be multi-films as shown in FIG. 4. The first to third conductive films 114_a, 114_b and 114_c may each include, for example, polysilicon, TiN, TiSiN, tungsten, tungsten silicide or a combination thereof. For example, although the first conductive film 114_a may include polysilicon, the second conductive film 114_b may include TiSiN, and the third conductive film 114_c may include tungsten, the embodiment is not limited thereto.

The first capping film 114_d may be formed on the third conductive film 114_c. The first capping film 114_d may include, but is not limited to, silicon nitride.

The direct contact DC may penetrate the insulating pattern 111 and connect the active region ACT of the substrate 100 and the bit line structure 113. For example, the substrate 100 may include a first trench T1 in the active region ACT. The first trench T1 may penetrate the insulating pattern 111 and expose a part of the active region ACT. The direct contact DC may be formed in the first trench T1 to connect the active region ACT of the substrate 100 and the first to third conductive films 114_a, 114_b and 114_c.

The first trench T1 may expose the center of the active region ACT, as shown in FIG. 4. A part of the first trench T1 may overlap a part of the element isolation film 103. Therefore, the first trench T1 may expose a part of the substrate 100 and a part of the element isolation film 103.

The direct contact DC may include a conductive material. Accordingly, the first to third conductive films 114_a, 114_b and 114_c of the bit line structure 113 may be electrically connected to the active region ACT of the substrate 100. The active region ACT of the substrate 100 connected to the direct contact DC may be a source/drain region.

The spacer structure 117 may extend along a sidewall of the bit line structure 113. A part of the spacer structure 117 may be formed in the first trench T1. The lower part of the spacer structure 117 may extend along the sidewall of the direct contact DC. That is, the direct contact DC may fill a part of the first trench T1, and the lower part of the spacer structure 117 may fill another part of the first trench T1. In the bit line structure 113 in which the direct contact DC is not formed, the spacer structure 117 may be formed on the insulating pattern 111.

The spacer structure 117 may include, for example, first to fourth spacers 117_a, 117_b, 117_c and 117_d. The first to fourth spacers 117_a, 117_b, 117_c and 117_d may include, but are not limited to, at least one of silicon nitride (SiN), silicon oxynitride (SiON), silicon oxide (SiO$_2$), silicon oxycarbide (SiOC), silicon carbonitride (SiCN), silicon oxycarbonitride (SiOCN), or combinations thereof.

The buried contact 160 may penetrate the insulating pattern 111 and connect the active region ACT of the substrate 100 and the landing pad 165. For example, the substrate 100 may include a second trench T2 in the active region ACT. The second trench T2 may penetrate the insulating pattern 111 and expose a part of the active region ACT. Here, the buried contact 160 may correspond to the buried contact BC of FIG. 2 and/or the storage contact 105 of FIG. 3 and FIG. 5 to be described later, and the landing pad 165 may correspond to the landing pad LP of FIG. 2 and the storage pad 115 of FIG. 3 and FIG. 5 to be described later.

The buried contact 160 may include, for example, at least one of an impurity-doped semiconductor material, a conductive silicide compound, a conductive metal nitride, and/or a metal. Accordingly, the buried contact 160 can be electrically connected to the active region ACT of the substrate 100. The active region ACT of the substrate 100 connected to the buried contact 160 may be a source/drain region.

The landing pad 165 may be formed on the buried contact 160. Landing pad 165 may also be referred to as a storage pad. Also, the landing pad 165 may be connected to the upper surface of the buried contact 160. In some embodiments, the upper surface of the landing pad 165 may be higher than the upper surface of the bit line structure 113. For example, the landing pad 165 may cover or overlap a part of the upper surface of the bit line structure 113.

Each landing pad 165 may be separated from other landing pads by a third trench T3.

The landing pad 165 may include, for example, at least one of an impurity-doped semiconductor material, a conductive silicide compound, a conductive metal nitride, and/or a metal. Accordingly, the capacitor CAP can be electrically connected to the active region ACT of the substrate 100.

Referring to FIG. 5, the storage contact 105 and the storage pad 115 may be disposed in the first interlayer insulating film 170 on the substrate 100. The first interlayer insulating film 170 may include, for example, at least one of silicon oxide, silicon nitride, a silicon oxynitride film (SiON), a silicon oxycarbonitride film (SiOCN), and/or a combination thereof. The first interlayer insulating film 170, according to some embodiments, may include TEOS (tetraethylortho silicate).

An etching stop film 200 may be disposed on the first interlayer insulating film 170. The etching stop film 200 may include an opening that exposes at least a part of the storage pad 115.

The etching stop film 200 may include, for example, at least one of silicon nitride (SiN), silicon carbonitride (SiCN), silicon boron nitride (SiBN), silicon oxycarbide (SiCO), silicon oxynitride (SiON), silicon oxide (SiN) and silicon oxycarbonitride (SiOCN). Here, silicon oxycarbide (SiCO) includes silicon (Si), carbon (C) and oxygen (O), but does not imply a particular ratio between silicon (Si), carbon (C) and oxygen (O). In other words, the elements silicon (Si), carbon (C) and oxygen (O) may be in any reasonable ratio.

The capacitor CAP may be disposed on the cell region CELL. The capacitor CAP may be disposed on the storage pad 115 and/or the etching stop film 200. The capacitor CAP may include a lower electrode 210, a capacitor dielectric film 220, an upper electrode 235, a lower supporter pattern 250 and an upper supporter pattern 260.

The lower electrode 210 may be disposed on the opening of the etching stop film 200. The lower electrode 210 may be disposed on the storage pad 115 exposed by the etching stop film 200. Therefore, a part of the sidewall of the lower electrode 210 may be in contact with, for example, the etching stop film 200.

Further, the lower electrode 210 may be disposed on the storage pad 115 and connected to the storage pad 115.

The lower electrode 210 may extend in a fourth direction D4 which is a thickness direction of the substrate 100. The width of the lower electrode 210 in the fourth direction D4 may be greater than the width of the lower electrode 210 in the first direction D1. The lower electrode 210 may have, for example, a pillar-like shape (i.e., extends longitudinally).

Here, the fourth direction D4 may be a direction perpendicular to the first direction D1 and/or the second direction D2. That is, the fourth direction D4 may be a direction parallel to the thickness direction of the substrate 100.

The lower electrode 210 may include, for example, but is not limited to, a doped semiconductor material, a conductive metal nitride (e.g., titanium nitride, tantalum nitride, niobium nitride or tungsten nitride, etc.), a metal (e.g., ruthenium, iridium, titanium, tantalum, etc.), and/or a conductive metal oxide (e.g., iridium oxide, niobium oxide, etc.).

The lower supporter pattern 250 may be disposed on the etching stop film 200 and be spaced apart from the etching stop film 200 in the fourth direction D4.

The lower supporter pattern 250 may be in contact with the lower electrode 210. The lower supporter pattern 250 may be in contact with a part of the sidewall of the lower electrode 210. The lower supporter pattern 250 may be disposed between the lower electrodes 210 adjacent to each other in the first direction D1.

The upper supporter pattern 260 may be disposed on the lower supporter pattern 250 to be spaced apart from the lower supporter pattern 250 in the fourth direction D4.

The upper supporter pattern 260 may be in contact with the lower electrode 210. The upper supporter pattern 260 may be in contact with a part of the sidewall of the lower electrode 210. The upper supporter pattern 260 may be disposed between the lower electrodes 210 adjacent to each other in the first direction D1. Although FIG. 5 shows that the lower supporter pattern 250 and the upper supporter pattern 260 are disposed between two lower electrodes 210, this is only for convenience of explanation, and the embodiments described herein are not limited thereto.

The upper supporter pattern 260 may be on, for example, the same plane as the upper surface of the lower electrode 210. In another example, the upper surface of the lower electrode 210 may protrude in the fourth direction D4 beyond the upper surface of the upper supporter pattern 260.

As shown in FIG. 5, the thickness of the upper supporter pattern 260 in the fourth direction D4 may be thicker than the thickness of the lower supporter pattern 250 in the fourth direction D4. However, the present disclosure is not limited thereto, and the thickness of the upper supporter pattern 260 in the fourth direction D4 may be the same as the thickness of the lower supporter pattern 250 in the fourth direction D4, according to some embodiments.

Also, unlike the shown example, the semiconductor device according to some embodiments may include only one of the lower supporter pattern 250 and the upper supporter pattern 260, and may further include an additional supporter pattern other than or in addition to the lower supporter pattern 250 and the upper supporter pattern 260.

The lower supporter pattern 250 and the upper supporter pattern 260 may include, for example, at least one of silicon nitride (SiN), silicon carbonitride (SiCN), silicon boron nitride (SiBN), silicon oxycarbide (SiCO), silicon oxynitride (SiON), silicon oxide (SiO), and/or silicon oxycarbonitride (SiOCN).

The capacitor dielectric film 220 may be disposed on the lower electrode 210. The capacitor dielectric film 220 may be formed along the surface of the lower electrode 210, the surface of the lower supporter pattern 250, the surface of the upper supporter pattern 260 and the upper surface of the etching stop film 200. The capacitor dielectric film 220 may extend along the profiles of the lower electrode 210, the upper supporter pattern 260, the lower supporter pattern 250 and the etching stop film 200. The capacitor dielectric film 220 may be in contact with, for example, the lower electrode 210, the upper supporter pattern, the lower supporter pattern 250 and the etching stop film.

Since the capacitor dielectric film 220 does not extend between the lower supporter pattern 250 and the lower electrode 210, and does not extend between the upper supporter pattern 260 and the lower electrode 210, the lower supporter pattern 250 and the upper supporter pattern 260 may be in contact with the lower electrode 210. Also, since the capacitor dielectric film 220 does not extend between the etching stop film 200 and the lower electrode 210, the etching stop film 200 may be in contact with the lower electrode 210.

The capacitor dielectric film 220 may include, for example, but is not limited to, at least one of silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and/or combinations thereof. Also, although the capacitor dielectric film 220 is shown as a single film in the drawings, this is only for convenience of explanation, and the embodiments described herein are not limited thereto.

According to some embodiments, the capacitor dielectric film 220 may have, for example, a stacked film structure of a ferroelectric material film having ferroelectric characteristics and a paraelectric material film.

The upper electrode 235 may be disposed on the capacitor dielectric film 220. The upper electrode 235 may be disposed on the cell region CELL, and may not extend to the peripheral region PERI. The upper electrode 235 on the storage pad 115 may have a first thickness W1 in the fourth direction D4.

The upper electrode 235 may include a liner electrode 230 and a plate electrode 240.

The liner electrode 230 may extend along the profile of the capacitor dielectric film 220.

The liner electrode 230 may include, for example, but is not limited to, a doped semiconductor material, a conductive metal nitride (e.g., titanium nitride, tantalum nitride, niobium nitride, tungsten nitride, etc.), a metal (e.g., ruthenium, iridium, titanium, tantalum, etc.), and/or conductive metal oxides (e.g., iridium oxide, niobium oxide, etc.).

The plate electrode 240 may be disposed on the liner electrode 230. That is, the liner electrode 230 may be disposed between the plate electrode 240 and the capacitor dielectric film 220.

The plate electrode 240 may include a first body 240_a on the liner electrode 230, and a first protrusion 240_b protruding from the first body 240_a. The first protrusion 240_b may protrude from the lower part of the first body 240_a in the first direction D1.

The plate electrode 240 may include, for example, at least one of an elemental semiconductor material film and/or a compound semiconductor material film. The plate electrode 240 may include doped n-type impurities or p-type impurities.

The elemental semiconductor material film may include, for example, one of a silicon film and a germanium film. The compound semiconductor material film may include, for example, a silicon germanium film. In the semiconductor device according to some embodiments, the plate electrode 240 may include a silicon germanium film.

The interface layer 300 may be disposed on the plate electrode 240. The interface layer 300 may be disposed on the cell region CELL, and may not be disposed on the peripheral region PERI. The interface layer 300 on the storage pad 115 may have a second thickness W2 in the fourth direction D4. The second thickness W2 may be, for example, smaller or less than the first thickness W1 in the fourth direction D4 of the upper electrode 235 on the storage pad 115.

The interface layer 300 may extend along the profile of the plate electrode 240. The interface layer 300 may be disposed on the upper surface and the side surface of the plate electrode 240 and the upper surface of the first protrusion 240_b. The interface layer 300 may be in contact with the upper surface and the side surface of the plate electrode 240 and the upper surface of the first protrusion 240_b.

The side surface of the interface layer 300 may be placed on the same plane as the side surface of the upper electrode 235. The side surface of the interface layer 300 may be placed on the same plane as the side surface of the first protrusion 240_b of the plate electrode 240 and the side surface of the liner electrode 230.

The interface layer 300 may include a hydrogen blocking film 310 and a hydrogen bypass film 320.

The hydrogen blocking film 310 may be disposed on the plate electrode 240. The hydrogen blocking film 310 may be in contact with the plate electrode 240. The hydrogen blocking film 310 may extend along the profile of the plate electrode 240. The hydrogen blocking film 310 may be disposed on the upper surface and the side surface of the plate electrode 240 and the upper surface of the first protrusion 240_b, but may not extend to be in contact with the capacitor dielectric 220 and/or the portion of the liner electrode 230 that is in contact with the capacitor dielectric 220.

The hydrogen blocking film 310 may include a second body 310_a conformally formed along the upper surface and the side surface of the plate electrode 240, and a second protrusion 310_b protruding from the second body 310_a in the first direction D1. The second protrusion 310_b may be disposed under the second body 310_a. That is, the hydrogen blocking film 310 may have an L shape on the first protrusion 240_b of the plate electrode 240.

A part of the second body 310_a and the second protrusion 310_b may be disposed on the first protrusion 240_b of the plate electrode 240.

The hydrogen blocking film 310 may have, for example, a thickness of 10 Å or more and 1000 Å in the fourth direction D4.

The hydrogen blocking film 310 may prevent hydrogen from flowing into the capacitor CAP. The hydrogen blocking film 310 may include a material having a low hydrogen diffusivity. The hydrogen blocking film 310 may include, for example, an insulating material. The hydrogen blocking film 310, according to some embodiments, may include a metal oxide such as silicon nitride (SiN) and/or aluminum oxide (AlOx).

The hydrogen bypass film 320 may be disposed on the hydrogen blocking film 310. The hydrogen bypass film 320 may be in contact with the hydrogen blocking film 310. The hydrogen bypass film 320 may extend along the profile of the hydrogen blocking film 310. The hydrogen bypass film 320 may be conformally formed along the upper surface and the side surfaces of the hydrogen blocking film 310. The hydrogen bypass film 320 may not extend to and may not contact the plate electrode 240.

The hydrogen bypass film 320 may be disposed on the upper surface and side surfaces of the second body 310_a of the hydrogen blocking film 310 and on the upper surface of the second protrusion 310_b. The hydrogen bypass film 320 may have an I shape on the first protrusion 240_b of the plate electrode 240 and the second protrusion 310_b of the hydrogen blocking film 310. That is, the hydrogen bypass film 320 may not include a protrusion.

Although FIG. 5 shows the hydrogen bypass film 320 having an I shape, embodiments described herein are not limited thereto, and the hydrogen bypass film 320 may also further include a protrusion and have an L shape.

The hydrogen bypass film 320 may have, for example, a thickness of 10 Å or more and 1000 Å in the fourth direction D4. The thickness of the hydrogen bypass film 320 may or may not be the same as the thickness of the hydrogen blocking film 310. The thickness of the hydrogen bypass film 320 may be, for example, larger or smaller than the thickness of the hydrogen blocking film 310.

The hydrogen bypass film 320 may function as a bypass passage for hydrogen flowing into the capacitor CAP. The hydrogen bypass film 320 may include a material having high hydrogen diffusivity. The hydrogen bypass film 320 may include, for example, a conductive material. The hydrogen bypass film 320 may include, for example, a metal material. The hydrogen bypass film 320 according to some embodiments may include tungsten (W), copper (Cu), aluminum (Al), or the like.

The second interlayer insulating film 270 may be disposed on the interface layer 300. The second interlayer insulating film 270 may cover all of the interface layer 300, the side surface of the plate electrode 240 and the etching stop film 200. According to some embodiments, the second interlayer insulating film 270 may overlap a portion of the interface layer 300, the side surface of a portion of the plate electrode 240 and/or a portion of the etching stop film 200

The first contact plug 275 may be disposed in the second interlayer insulating film 270 and the interface layer 300. The lower part of the first contact plug 275 may be in contact with the interface layer 300. The upper part of the first contact plug 275 may be in contact with the second interlayer insulating film 270. The first contact plug 275 may penetrate the second interlayer insulating film 270 and the hydrogen bypass film 320 and/or the hydrogen blocking film 310 of the interface layer 300.

The first contact plug 275 may be disposed on the plate electrode 240. The first contact plug 275 may penetrate the second interlayer insulating film 270 and the interface layer 300 and be connected to the plate electrode 240. The first contact plug 275 may be electrically connected to the plate electrode 240. Although FIG. 5 shows that only the first contact plug 275 is disposed, the embodiments described herein are not limited thereto, and it is a matter of course that an additional upper contact may be additionally disposed.

The upper surface of the first contact plug 275 and the upper surface of the second interlayer insulating film 270 may be placed on the same plane. The third interlayer insulating film 370 may be disposed on the first contact plug 275 and the second interlayer insulating film 270.

The first wiring layer 375 may be included in the third interlayer insulating film 370. The first wiring layer 375 may be disposed on the first contact plug 275. The first wiring layer 375 may be electrically connected to the first contact plug 275.

The second wiring layer 475 may be disposed on the first wiring layer 375. The second wiring layer 475 may be electrically connected to the first wiring layer 375. Although FIG. 5 shows that the first and second wiring layers 475 are disposed, the present disclosure is not limited thereto, and it is a matter of course that an additional wiring layer may be further disposed.

The first contact plug 275, the first wiring layer 375 and the second wiring layer 475 may include, for example, a conductive material such as copper (Cu), tungsten (W), and/or aluminum (Al).

The passivation layer 400 may be disposed on the third interlayer insulating film 370. The passivation layer 400 may include a second wiring layer 475. The passivation layer 400 may cover or overlap the second wiring layer 475.

The passivation layer 400, according to some embodiments, may include a large amount of hydrogen. The passivation layer 400 may be an insulating film having a hydrogen content relatively higher than the first and second interlayer insulating films 270. The passivation layer 400 may include, for example, HDP CVD (high density plasma chemical vapor deposition) oxide. The passivation layer 400 may be subjected to an alloy process through a heat treatment to be described later.

Referring again to FIG. 3, the peripheral region PERI may include a substrate 100, a peripheral gate structure 102, an element isolation film 103, a first interlayer insulating film 170, a second contact plug 285, a second interlayer insulating film 270, a first wiring layer 375, a passivation layer 400 and a second wiring layer 475.

The peripheral gate structure 102 may be disposed on the active region ACT of the substrate 100. The first interlayer insulating film 170 may cover or overlap the peripheral gate structure 102 and the substrate 100.

The second contact plug 285 may penetrate the second interlayer insulating film 270 and the first interlayer insulating film 170, and be disposed on the substrate 100. The second contact plug 285 may be electrically connected to the active region ACT of the substrate 100. The active region ACT of the substrate 100 connected to the second contact plug 285 may be a source/drain region.

The second contact plug 285 may be connected to the first wiring layer 375 and the second wiring layer 475. The second contact plug 285 may include, for example, a conductive material.

Figure 6:
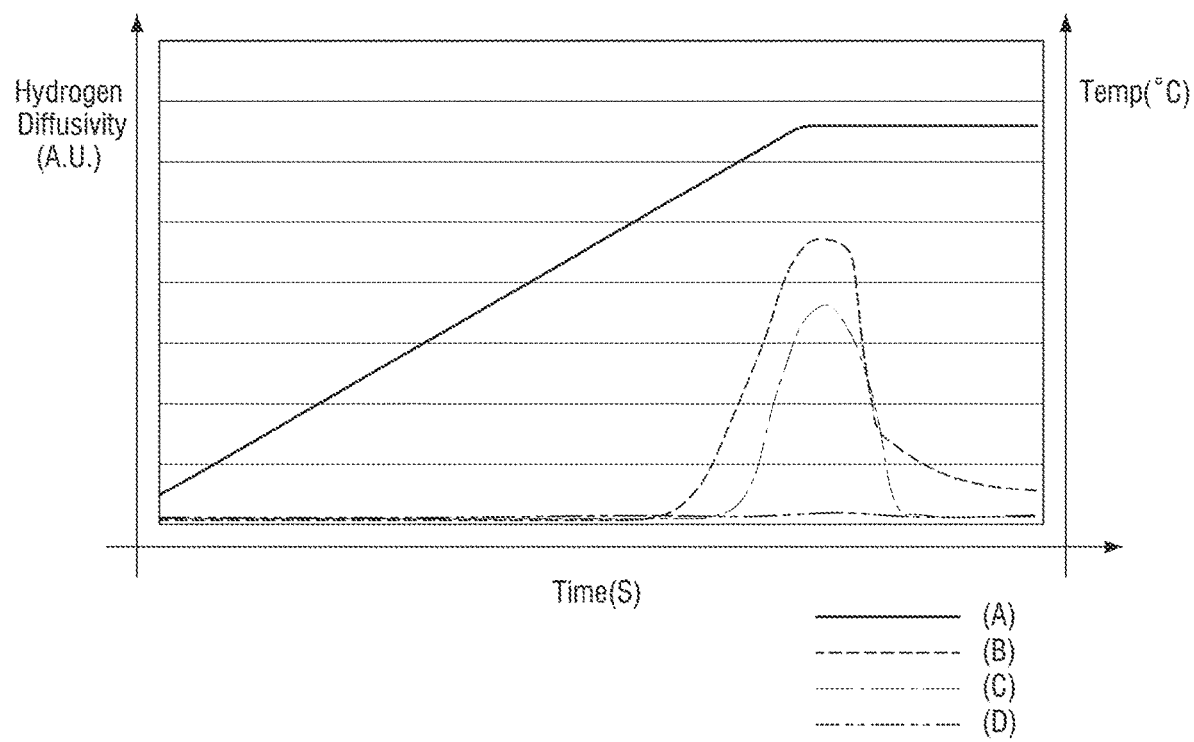
FIG. 6 is a schematic graph showing a hydrogen diffusivity on an interface layer of FIG. 5.

FIG. 6 is a schematic graph showing the hydrogen diffusivity of the interface layer of FIG. 5.

Referring to FIG. 6, line (A) shows the temperature of the interface layer and the hydrogen diffusivity depending on the heat treatment time. That is, as the heat treatment time increases, the temperature of the interface layer increases and the hydrogen diffusion may also increase.

Line (B) shows a case where the interface layer incudes TEOS. In this case, after a certain time, the hydrogen diffusivity increases simultaneously with an increase in the temperature of the interface layer. However, the temperature and diffusivity of the interface layer 300 may decrease again after some time period has elapsed.

Line (C) shows a case where the interface layer includes TEOS and tungsten. In this case, the hydrogen diffusivity may be lower than that in Line (B) for some time period.

Line (D) shows a case where the interface layer includes TEOS and silicon nitride (SiN) or aluminum oxide (AlOx). In this case, there may be almost no hydrogen diffusivity over time.

That is, in the case of a metal material such as tungsten, the hydrogen diffusivity is high, and in the case of a metal oxide such as silicon nitride or aluminum oxide, the hydrogen diffusivity may be very low. Therefore, since the hydrogen bypass film (320 of FIG. 5), according to some embodiments of the present disclosure, has a high hydrogen diffusivity, it is possible to supply hydrogen to the transistors, and since the hydrogen blocking film (310 of FIG. 5) has a low hydrogen diffusivity, it is possible to prevent or reduce the hydrogen supply to the capacitors. Hereinafter, a detailed explanation will be provided referring to FIG. 6.

Figure 7:
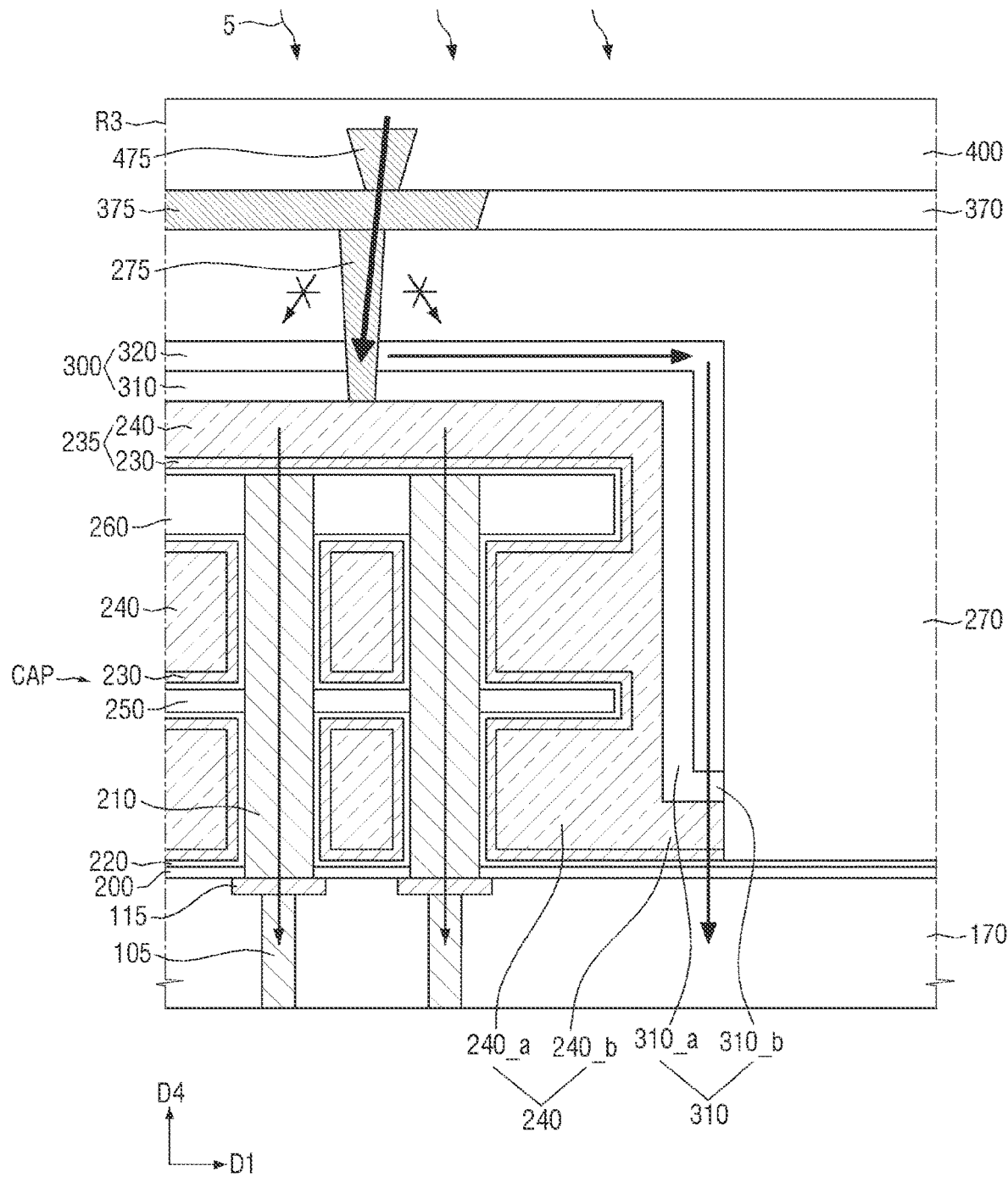
FIG. 7 is a diagram of the operation of the semiconductor device of FIG. 5.

FIG. 7 is a diagram for explaining the operation of the semiconductor device of FIG. 5. Specifically, hydrogen diffusion, denoted by arrows, will be discussed with respect to FIG. 7.

A defect may occur in the semiconductor device during fabricating processes such as an oxidation process and/or an etching process. The defects may include, for example, a structural defect of a silicon crystal such as a dangling bond at an interface between the silicon oxide film and the silicon substrate, an interface between the gate oxide film and the substrate, or the like.

In the case of DRAM, a refresh operation is performed every refresh cycle to retain data. Due to the aforementioned defect, a leak current (GIDL; Gate Induced Drain Leakage) of the DRAM may increase, the refresh cycle may be shortened, and the electrical characteristics of the DRAM may be degraded accordingly.

In order to maintain the refresh cycle of the DRAM, a method of supplying hydrogen to the defect may be performed as one of methods of suppressing the leakage current. An unstable silicon lattice may be supplied with hydrogen and combined with hydrogen, which allows the defect to be cured.

However, if hydrogen is supplied excessively, hydrogen may permeate inside the DRAM capacitor CAP. Hydrogen permeating inside the capacitor CAP may reduce the capacitor dielectric film 220 and deteriorate the dielectric characteristics of the capacitor dielectric film 220. As a result, the data stored in the DRAM may not be retained properly and a defect may occur.

Referring to FIG. 6, in the semiconductor device according to some embodiments, after the first and second contact plugs 275 and 285 and the first and second wiring layers 375 and 475 are formed, an alloy process 5 may be performed. The alloy process 5 may be performed by a heat treatment conducted at a temperature of about 300° C. to 500° C. for several tens to several hundreds of minutes.

The heat treatment process may be performed on the passivation layer 400. As a result, hydrogen may be supplied or diffused from the passivation layer 400 to the capacitor CAP through the first and second wiring layers 375 and 475 and the first and second contact plugs 275 and 285.

At this time, the hydrogen blocking film 310 may prevent or reduce the supply of hydrogen to the inside of the capacitor CAP. Therefore, it is possible to prevent or improve the deterioration of the electrical characteristics of the semiconductor device.

Further, in this case, since the hydrogen diffusivity of the hydrogen bypass film 320 is high, hydrogen supplied through the first and second wiring layers 375 and 475 and the first and second contact plugs 275 and 285 may be supplied to the transistors through the hydrogen bypass film 320. That is, almost all the supplied hydrogen may be supplied to the transistors through the hydrogen bypass film 320. Therefore, the defects of the semiconductor device are be cured, and a refresh cycle or a data retention time of the semiconductor device can be maintained or improved. As shown in FIG. 7, reduced hydrogen diffusion "X" occurs into the second interlayer insulating film 270. In some embodiments, hydrogen does not diffuse in the direction of the arrows marked "X".

That is, since the semiconductor device according to some embodiments of the present disclosure includes the hydrogen bypass film 320 and the hydrogen blocking film 310, it is possible to reduce or prevent hydrogen supply to the capacitor but supply hydrogen to the transistors, such that electrical characteristics can be improved accordingly.

Figure 8:
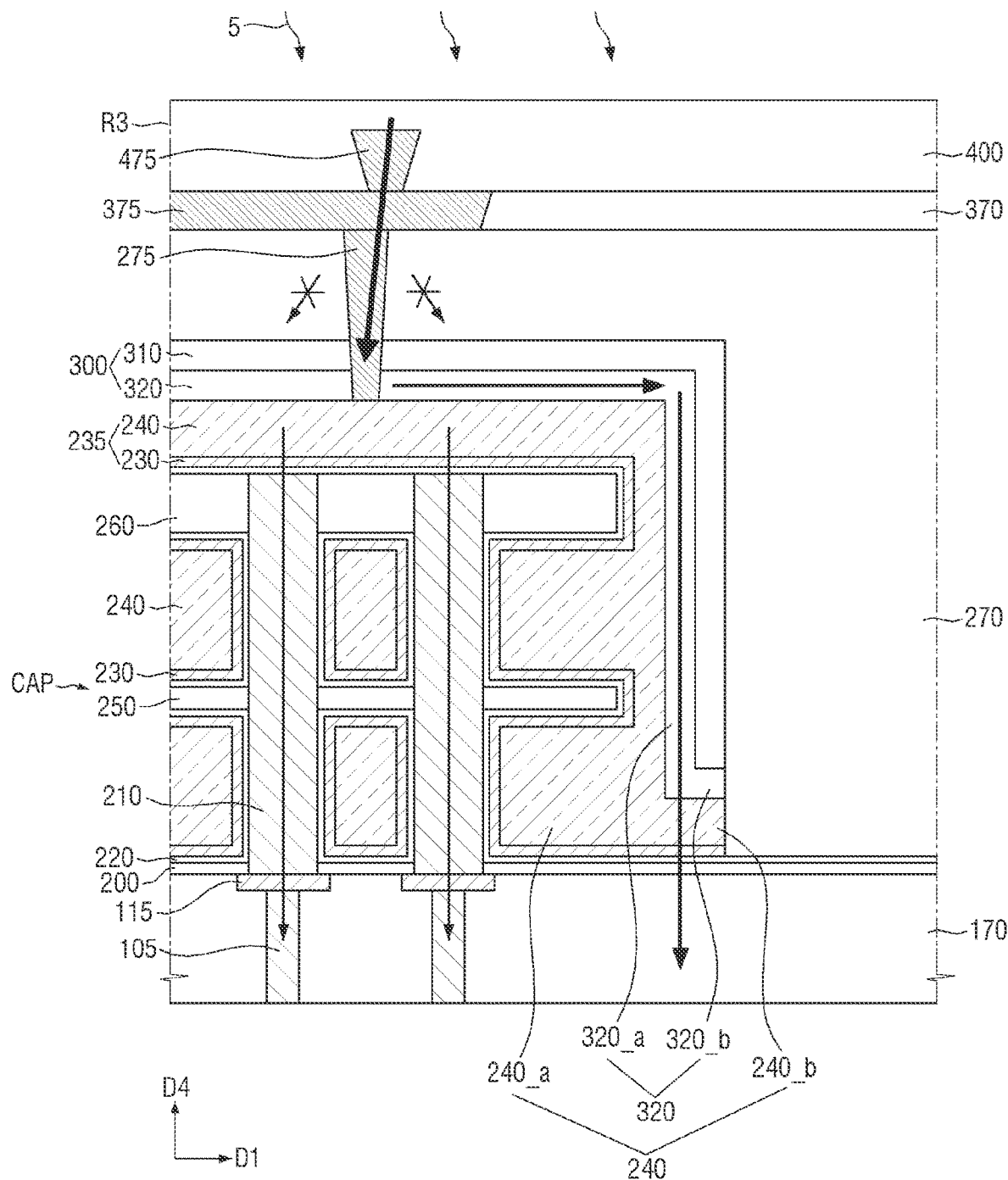
FIG. 8 is a diagram of a semiconductor device according to some embodiments.

FIG. 8 is a diagram for explaining a semiconductor device, according to some embodiments. For convenience of explanation, differences from those explained using FIGS. 1 to 7 will be mainly explained.

Referring to FIG. 8, a semiconductor device according to some other embodiments of the present disclosure may include a hydrogen bypass film 320, and a hydrogen blocking film 310 on an upper surface of the hydrogen bypass film 320.

The hydrogen bypass film 320 may be in contact with the plate electrode 240. The hydrogen bypass film 320 may extend along the profile of the plate electrode 240. The hydrogen bypass film 320 may be disposed on the upper surface and the side surface of the plate electrode 240 and on the upper surface of the first protrusion 240_b.

The hydrogen bypass film 320 may include a second body 320_a formed conformally along the upper surface and the side surface of the plate electrode 240, and a second protrusion 320_b protruding from the second body 320_a in the first direction D1. The second protrusion 320_b may be disposed under the second body 320_a. That is, the hydrogen bypass film 320 may have an L shape on the first protrusion 240_b of the plate electrode 240.

A part of the second body 320_a and the second protrusion 320_b may be disposed on the first protrusion 240_b of the plate electrode 240.

The hydrogen blocking film 310 may be disposed on the upper surface and side surface of the second body 320_a of the hydrogen bypass film 320, and on the upper surface of the second protrusion 320_b. The hydrogen blocking film 310 may have an I shape on the first protrusion 240_b of the plate electrode 240 and the second protrusion 320_b of the hydrogen bypass film 320. That is, the hydrogen blocking film 310 may not include a protrusion, according to some embodiments.

Although FIG. 8 shows the hydrogen blocking film 310 having an I-shape, the embodiment is not limited thereto, and the hydrogen blocking film 310 may also further include a protrusion and have an L shape.

Hydrogen supplied from the passivation layer 400 to the first contact plug 275 by the alloy process may not flow into the capacitor by the hydrogen blocking film 310. Hydrogen supplied to the interface layer 300 through the first contact plug 275 may be supplied to the transistors through the hydrogen bypass film 320. As shown in FIG. 8, reduced hydrogen diffusion "X" occurs into the second interlayer insulating film 270. In some embodiments, hydrogen does not diffuse in the direction of the arrows marked "X".

Figure 9:
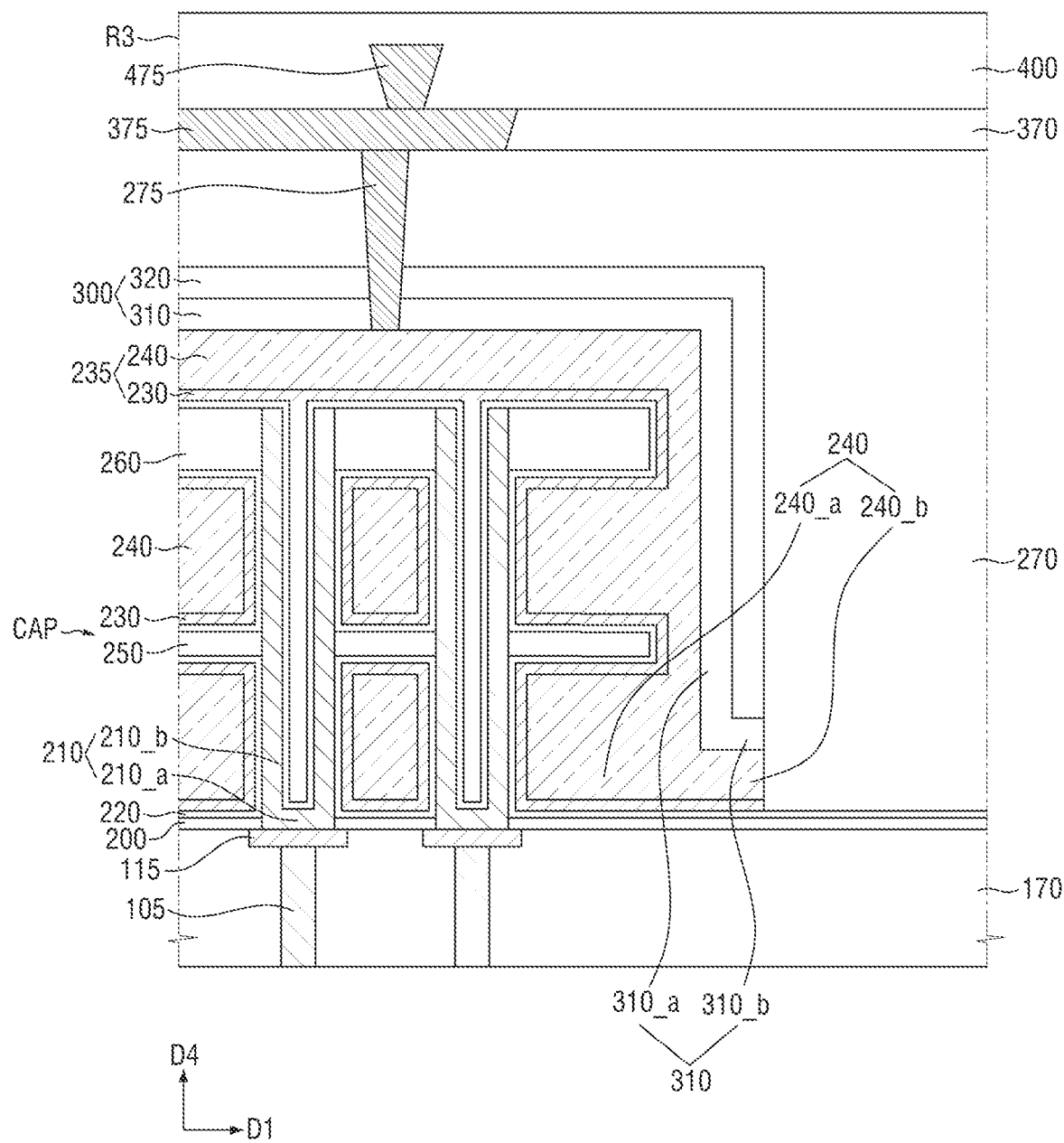
FIG. 9 is a diagram of a semiconductor device according to some embodiments.

FIG. 9 is a diagram for explaining a semiconductor device according to some embodiments. For convenience of explanation, differences from those explained using FIGS. 1 to 8 will be mainly explained.

Referring to FIG. 9, a lower electrode 210 of a semiconductor device according to some embodiments of the present disclosure may have a bottom part 210_a extending along an upper surface of a storage pad 115, and a protrusion 210_b protruding from the bottom part 210_a.

The bottom part 210_a of the lower electrode 210 may be aligned with the substrate 100. The protrusions 210_b of the lower electrode 210 may protrude from both ends of the bottom part 210_a of the lower electrode 210. The bottom part 210_a of the lower electrode 210 may extend in the fourth direction D4.

The bottom part 210_a of the lower electrode 210 may have a three-dimensionally barrel-like shape. The lower electrode 210 may have, for example, a cylindrical shape.

Although FIG. 9 shows that the hydrogen bypass film 320 is formed on the upper surface of the hydrogen blocking film 310, the present disclosure is not limited thereto, and the hydrogen blocking film 310 may, of course, be formed on the upper surface of the hydrogen bypass film 320.

Figure 10:
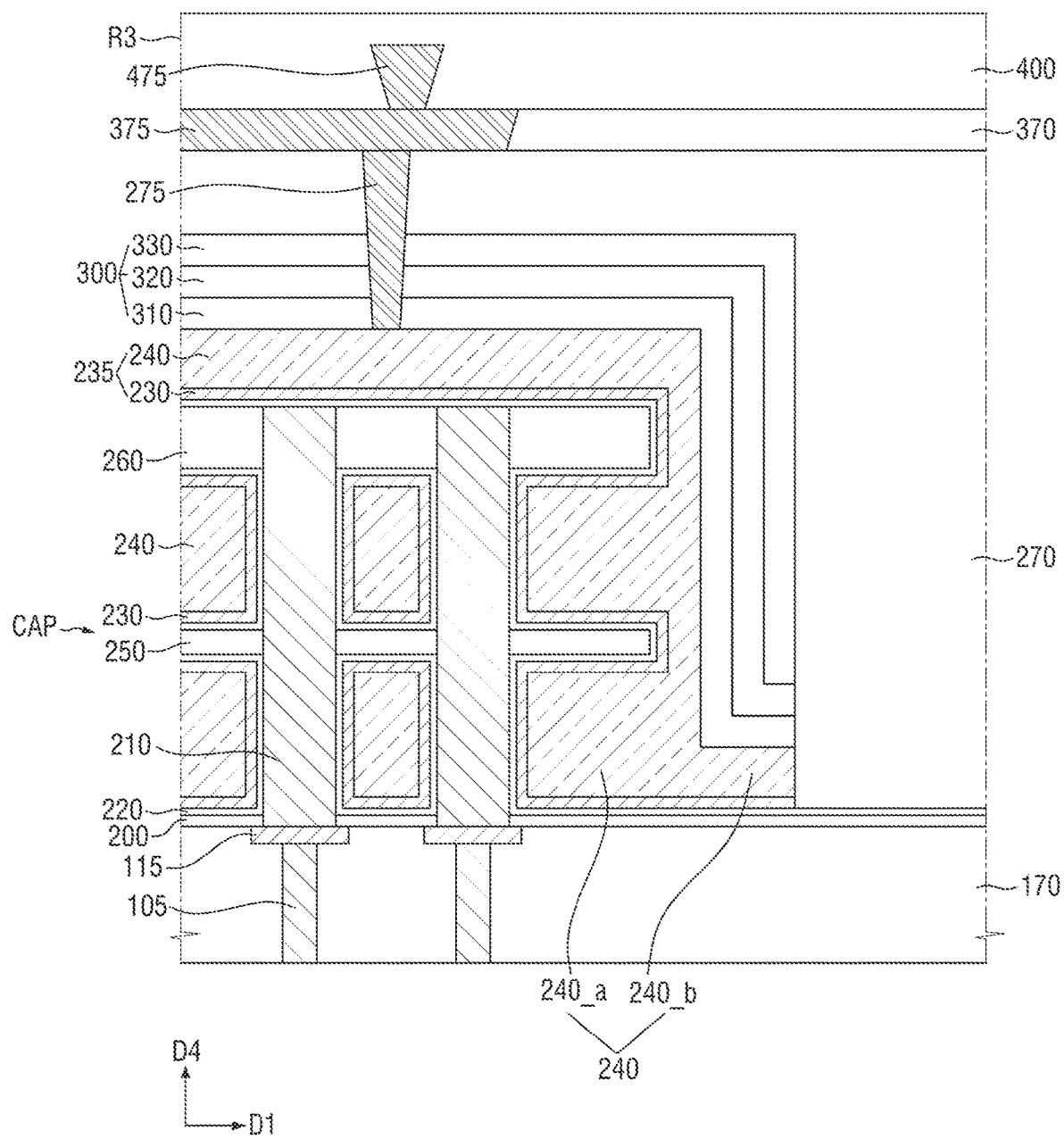
FIG. 10 is a diagram of a semiconductor device according to some embodiments.

FIG. 10 is a diagram for explaining a semiconductor device according to some embodiments.

For convenience of explanation, differences from those explained using FIGS. 1 to 9 will be mainly explained.

Referring to FIG. 10, the semiconductor device according to some embodiments of the present disclosure may further include a second hydrogen blocking film 330. The hydrogen bypass film 320 may be disposed between the first hydrogen blocking film 310 and the second hydrogen blocking film 330.

The first hydrogen blocking film 310 and the hydrogen bypass film 320 may have an L shape, and the second hydrogen blocking film 330 may have an I shape. The side surfaces of the liner electrode 230, the plate electrode 240, the first hydrogen blocking film 310, the hydrogen bypass film 320 and the second hydrogen blocking film 330 may be on the same plane.

Although FIG. 10 shows that the second hydrogen blocking film 330 has an I shape, the present disclosure is not limited thereto, and the second hydrogen blocking film 330 may also have an L shape, according to some embodiments.

Figure 11:
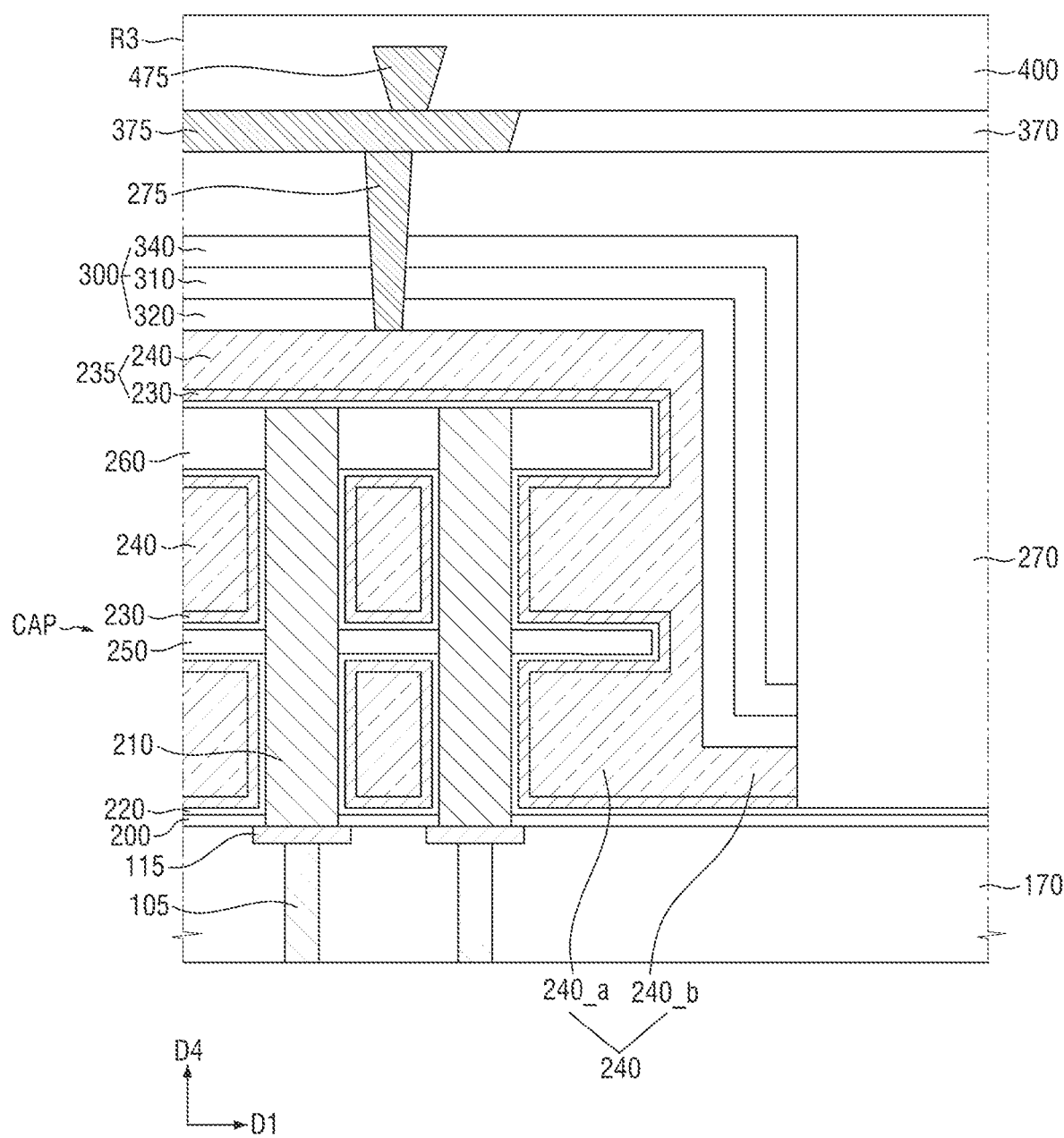
FIG. 11 is a diagram of a semiconductor device according to some embodiments.

FIG. 11 is a diagram for explaining a semiconductor device according to some embodiments. For convenience of explanation, differences from those explained using FIGS. 1 to 10 will be mainly explained.

Referring to FIG. 11, a semiconductor device according to some embodiments of the present disclosure may further include a second hydrogen bypass film 340. The hydrogen blocking film 310 may be disposed between the first hydrogen bypass film 320 and the second hydrogen bypass film 340.

The first hydrogen bypass film 320 and the hydrogen blocking film 310 may have an L shape, and the second hydrogen bypass film 340 may have an I shape. The side surfaces of the liner electrode 230, the plate electrode 240, the hydrogen blocking film 310, the first hydrogen bypass film 320 and the second hydrogen blocking film 330 may be on the same plane.

Although FIG. 10 shows the second hydrogen bypass film 340 having an I shape, the present disclosure is not limited thereto, and the second hydrogen bypass film 340 may also have an L shape.

Figure 12:
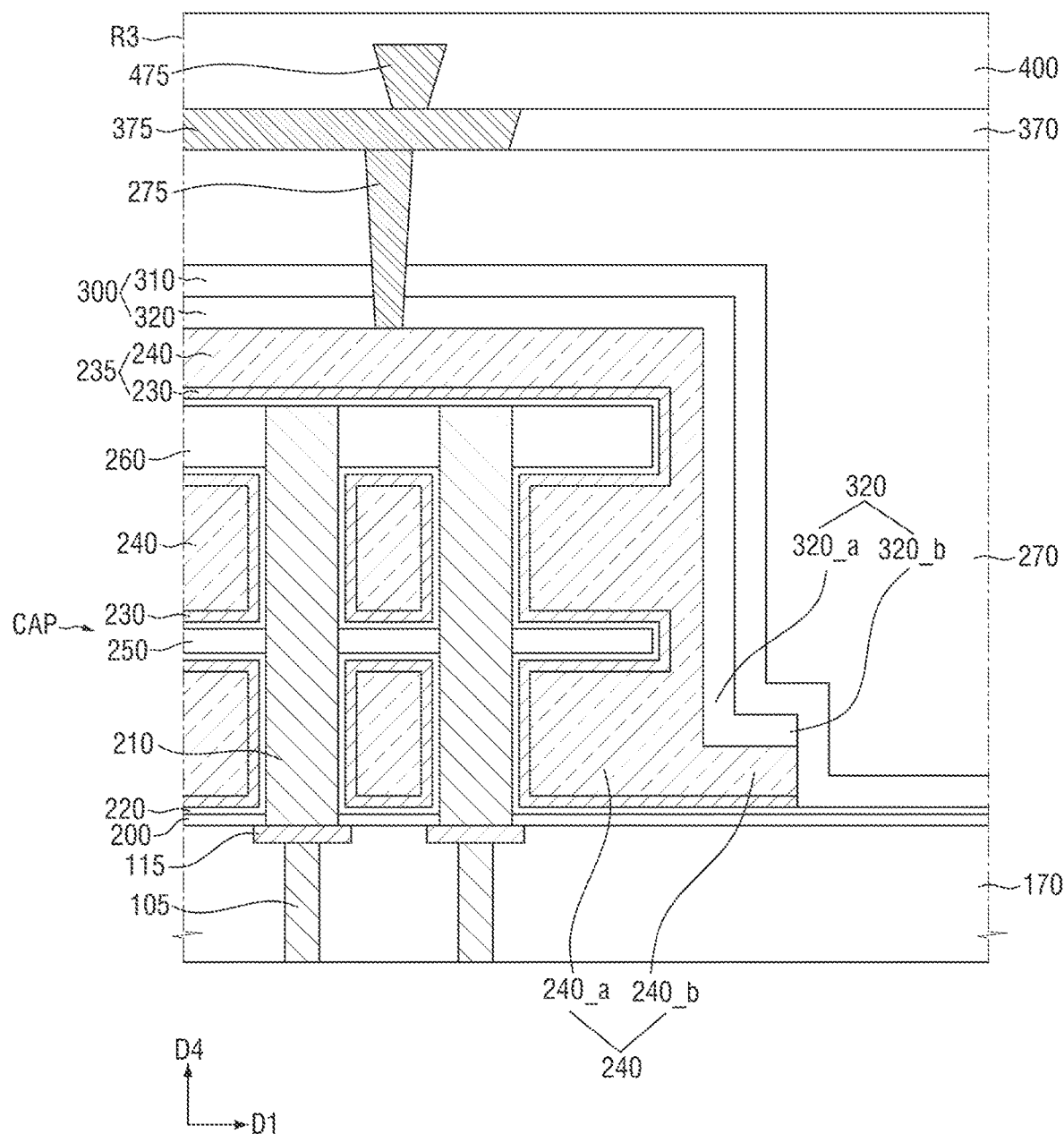
FIG. 12 is a diagram of a semiconductor device according to some embodiments.

FIG. 12 is a diagram for explaining a semiconductor device according to some embodiments. For convenience of explanation, differences from those explained using FIG. 8 will be mainly explained.

Referring to FIG. 12, a hydrogen blocking film 310 may be disposed on the hydrogen bypass film 320, the plate electrode 240, the liner electrode 230 and the capacitor dielectric film 220. The hydrogen blocking film 310 may be conformally formed along the profiles of the hydrogen bypass film 320, the plate electrode 240, the liner electrode 230 and the capacitor dielectric film 220. The hydrogen blocking film 310 may further extend in the first direction D1 beyond the hydrogen bypass film 320.

Therefore, the side surfaces of the hydrogen blocking film 310 may not be on the same plane as the side surfaces of the hydrogen bypass film 320 and the plate electrode 240.

Figure 13:
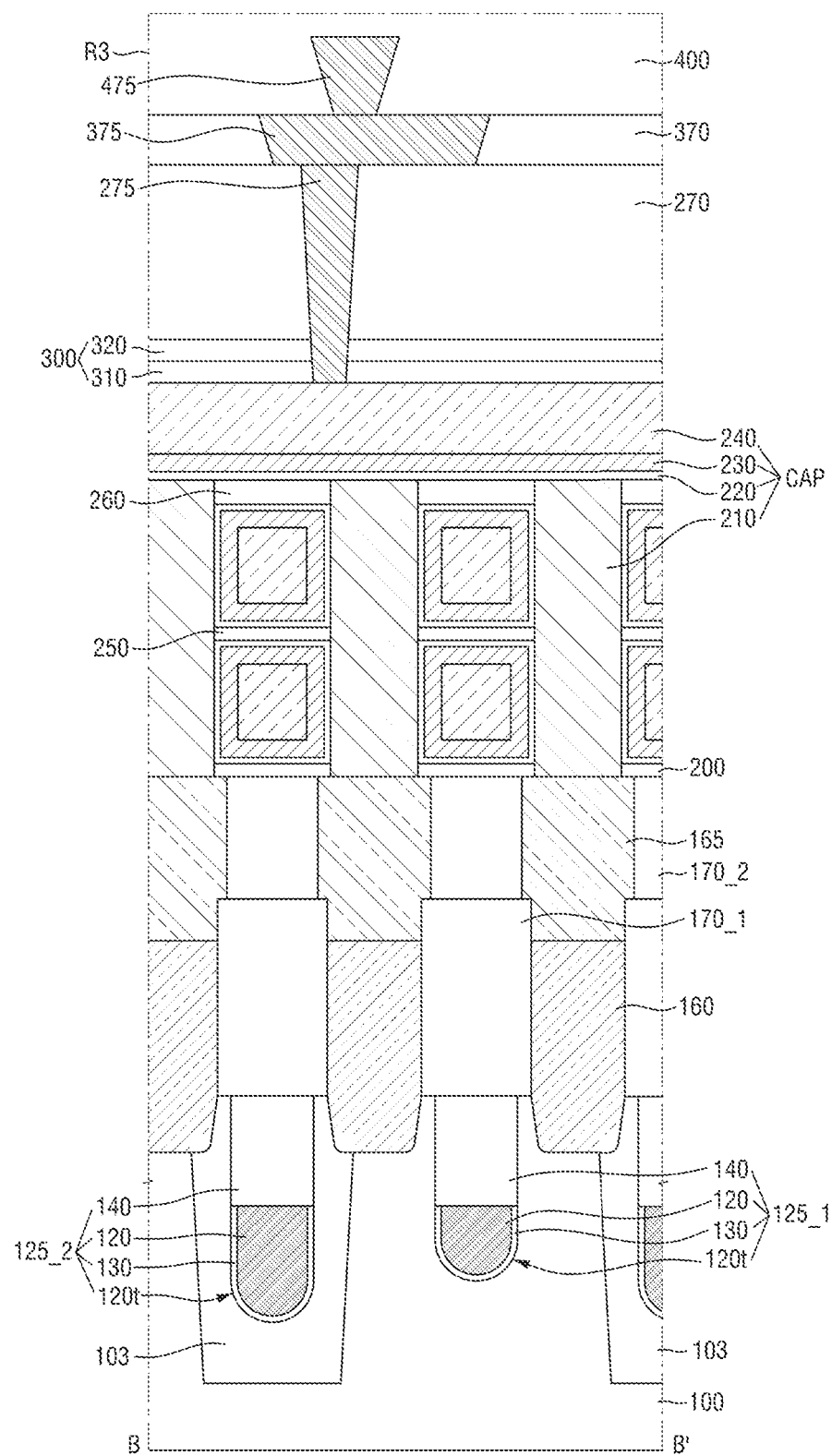
FIG. 13 is a cross-sectional view taken along a line B-B' of FIG. 2.

FIG. 13 is a cross-sectional view taken along a line B-B' of FIG. 2. For convenience of explanation, differences from those explained using FIGS. 1 to 5 will be mainly explained.

Referring to FIGS. 2 and 13, a semiconductor device, according to some embodiments, may include gate structures 125_1 and 125_2, a buried contact 160, a landing pad 165, and a capacitor CAP.

The gate structures 125_1 and 125_2 may be formed in the substrate 100 and the element isolation film 103. The gate structures 125_1 and 125_2 may be formed across the element isolation film 103, and the active region ACT defined by the element isolation film 103.

The gate structures 125_1 and 125_2 may include a gate structure 125_1 in the active region ACT of the substrate 100, and a gate structure 125_2 in the element isolation film 103.

The gate structures 125_1 and 125_2 may include a buried gate trench 120t, a gate insulating film 130, a gate electrode 120, a gate electrode 120 and a second capping film 140 formed in the substrate 100 and the element isolation film 103. The gate electrode 120 may correspond to the word line WL.

For example, the depth of the buried gate trench 120t formed in the substrate 100 may be different from the depth of the buried gate trench 120t formed in the element isolation film 103.

The gate insulating film 130 may extend along the sidewall and bottom surface of the buried gate trench 120t. The gate insulating film 130 may extend along the profile of at least a part of the buried gate trench 120t.

The gate insulating film 130 may include, for example, at least one of silicon oxide, silicon oxynitride, silicon nitride, and a high dielectric constant material having a higher dielectric constant than silicon oxide.

The high dielectric constant material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The gate electrode 120 may be formed on the gate insulating film 130. The gate electrode 120 may fill or be in a part of the buried gate trench 120t.

The gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), polysilicon doped with impurities, polysilicon germanium doped with impurities, and/or combinations thereof. Each of the gate electrodes 120 may include a conductive metal oxide, a conductive metal oxynitride, or the like, and may include a form in which the aforementioned material is oxidized.

The second capping film 140 may be formed on the gate electrode 120. The second capping film 140 may fill or be in the remaining portion of the buried gate trench 120t after the gate electrode 120 is formed. The second capping film 140 may include, for example, at least one of silicon nitride (SiN), silicon oxynitride (SiON), silicon oxide (SiO$_2$), silicon carbonitride (SiCN), silicon oxycarbonitride (SiOCN), and/or combinations thereof.

A first lower interlayer insulating film 170_1 may be disposed on the substrate 100 and the element isolation film 103. The first lower interlayer insulating film 170_1 may cover or overlap the gate structures 125_1 and 125_2.

A first upper interlayer insulating film 170_2 may be formed on the first lower interlayer insulating film 170_1. The first upper interlayer insulating film 170_2 may be around the landing pad 165 in a plan view. The first lower interlayer insulating film 170_1 and the first upper interlayer insulating film 170_2 may correspond to the first interlayer insulating film 170 of FIGS. 1 to 12.

The capacitor CAP may be disposed on the landing pad 165, and the capacitor CAP may be electrically connected to the landing pad 165 and the buried contact 160.

Although FIG. 13 shows that the hydrogen bypass film 320 is formed on the upper surface of the hydrogen blocking film 310, the disclosure is not limited thereto, and the hydrogen blocking film 310 may, of course, be formed on the upper surface of the hydrogen bypass film 320.

Figure 14:
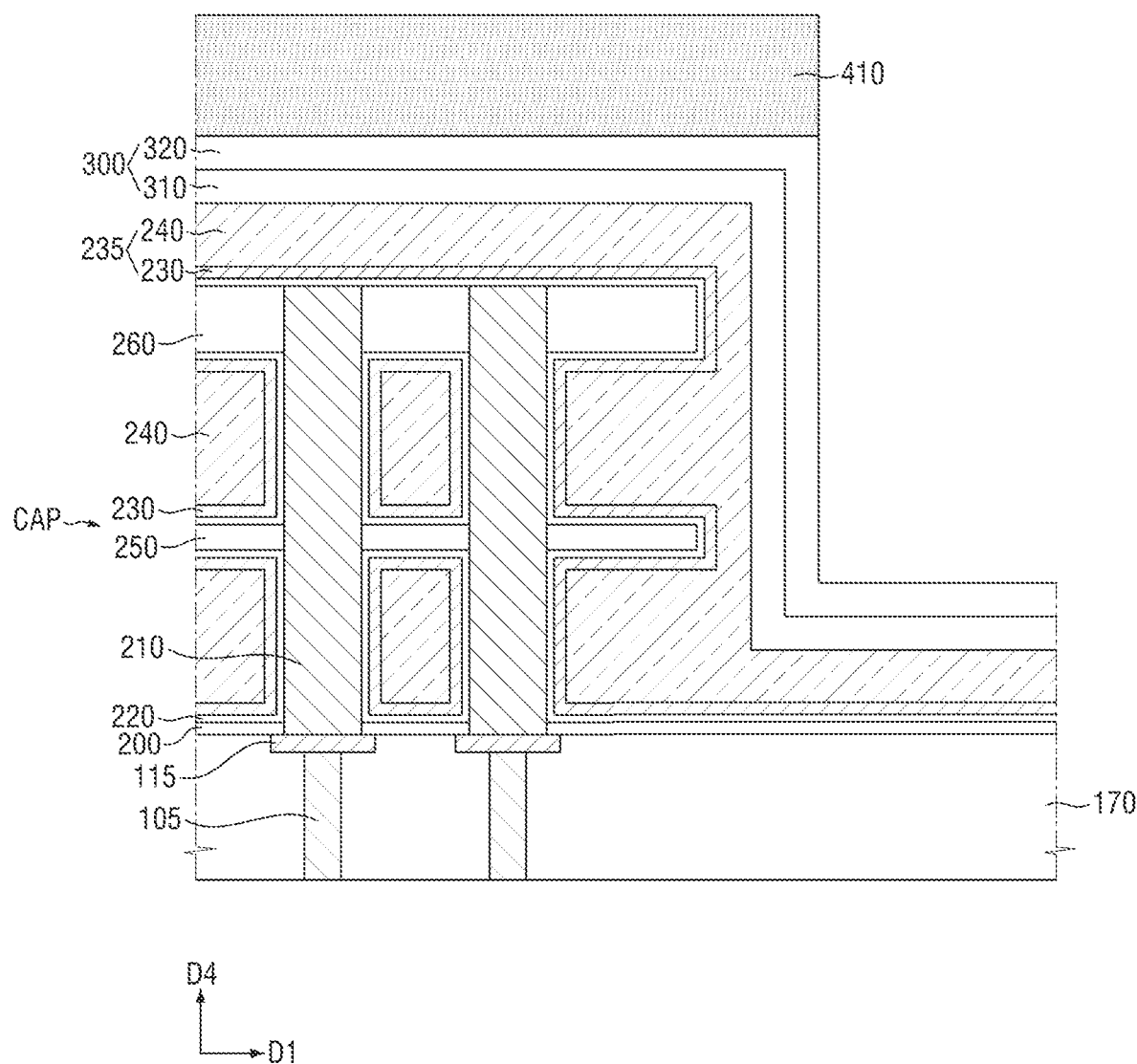
FIGS. 14 to 16 are intermediate stage diagrams of a method for fabricating a semiconductor device according to some embodiments.
Figure 15:
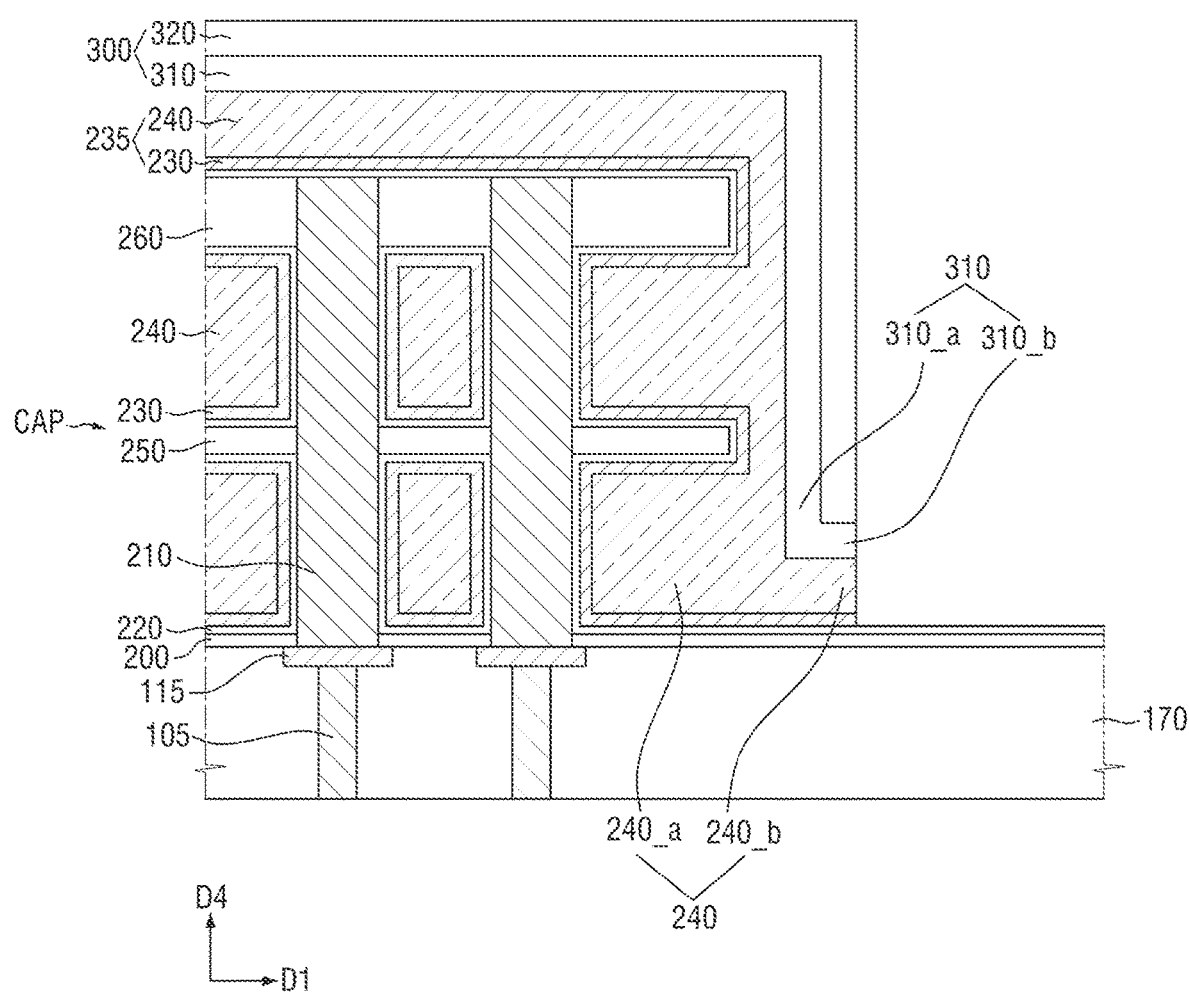
Figure 16:
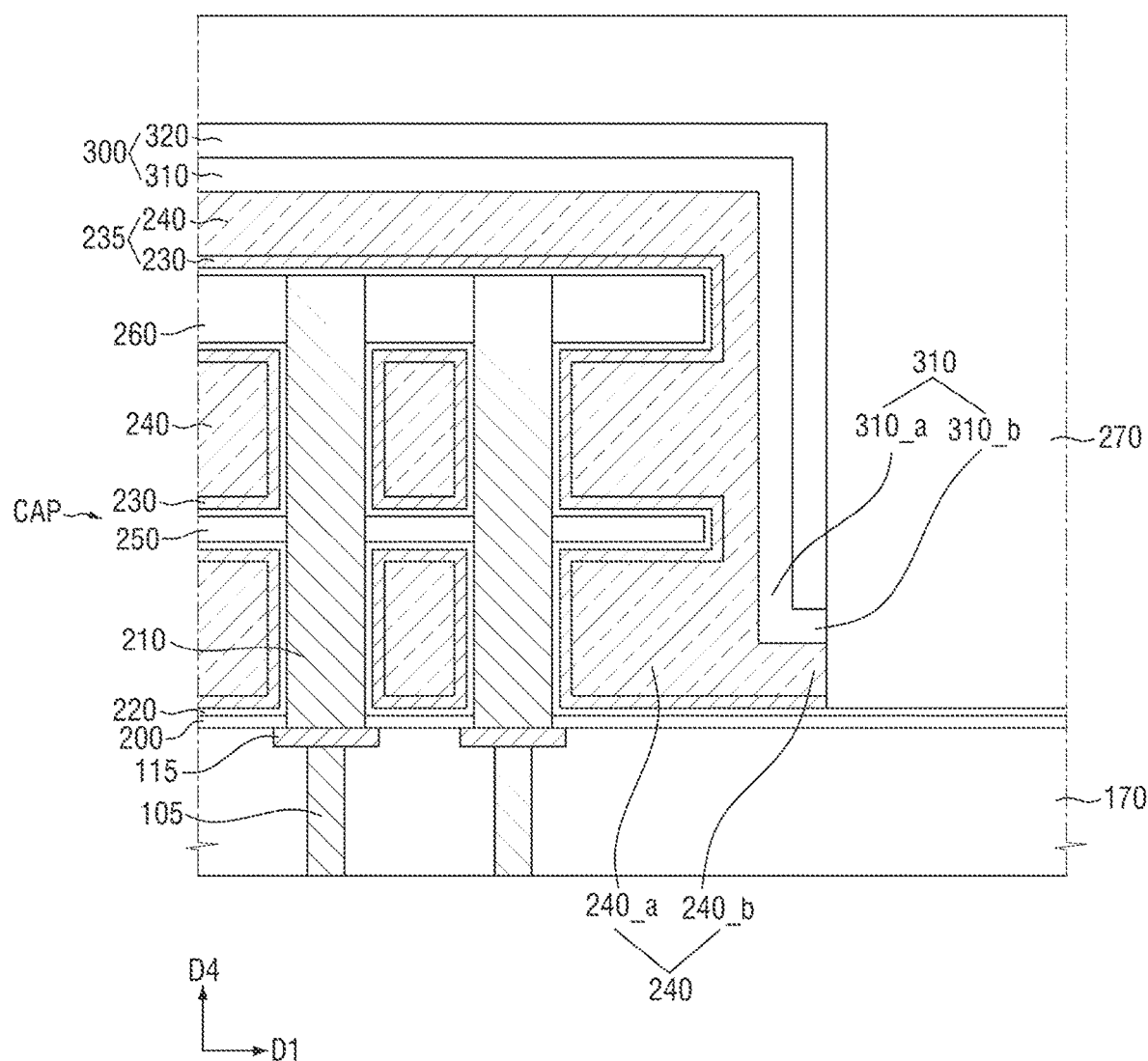

FIGS. 14 to 16 are intermediate stage diagrams for explaining a method for fabricating a semiconductor device according to some embodiments.

Referring to FIG. 14, the hydrogen blocking film 310 and the hydrogen bypass film 320 may be sequentially formed on the plate electrode 240.

A mask pattern 410 may be formed on the hydrogen blocking film 310. The side surface of the mask pattern 410 may be on the same plane as the side surface of the hydrogen blocking film 310. The mask pattern 410 may expose a part of the hydrogen bypass film 320. The mask pattern 410 may expose a part of the side surface and the upper surface of the hydrogen bypass film 320.

The mask pattern 410 may be a mask for cutting the plate electrode 240 and the liner electrode 230.

Referring to FIG. 15, some of the liner electrode 230, the plate electrode 240 and the interface layer 300 may be removed, using the mask pattern 410 of FIG. 14. Accordingly, the first protrusion 240_b of the plate electrode 240, and the second protrusion 310_b of the hydrogen blocking film 310 may be formed. Further, the side surfaces of the upper electrode 235 and the interface layer 300 may be placed on the same plane.

Referring to FIG. 16, the mask pattern 410 may be removed.

A second interlayer insulating film 270 may be formed on the interface layer 300, the exposed upper electrode 235 and the capacitor dielectric film 220.

Subsequently, referring to FIG. 5, a first contact plug 275, a third interlayer insulating film 370, a first wiring layer 375, a second wiring layer 475 and a passivation layer 400 may be formed.

Figure 17:
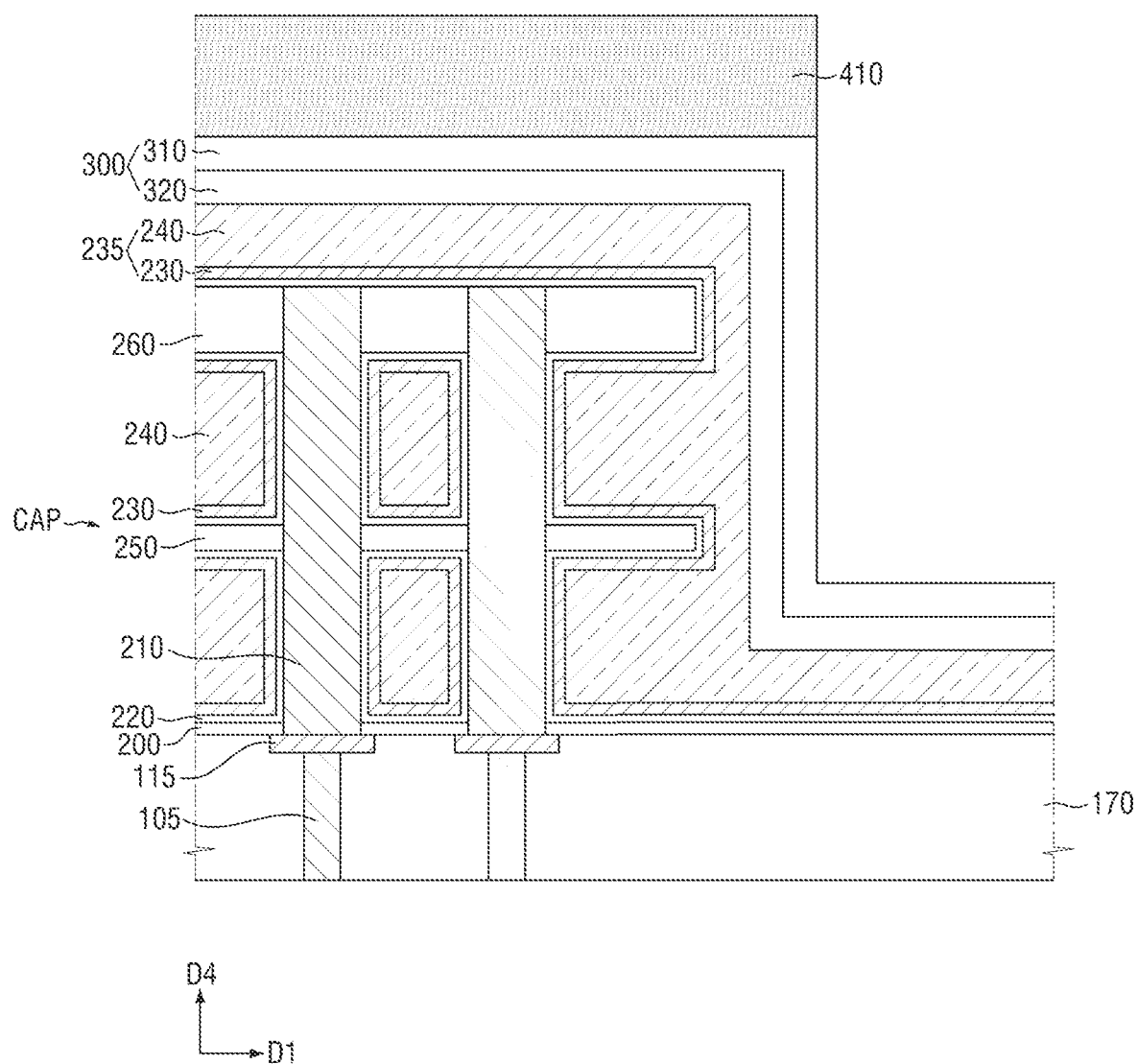
FIG. 17 is a diagram of a method for fabricating a semiconductor device according to some embodiments.

FIG. 17 is a diagram for explaining a method for fabricating a semiconductor device according to some embodiments. For convenience of explanation, differences from FIG. 15 will be mainly explained.

Referring to FIG. 17, the hydrogen bypass film 320 and the hydrogen blocking film 310 may be sequentially formed on the plate electrode 240.

A mask pattern 410 may be formed on the hydrogen bypass film 320. The side surface of the mask pattern 410 may be on the same plane as the side surface of the hydrogen blocking film 310. The mask pattern 410 may expose a part of the hydrogen blocking film 310. The mask pattern 410 may expose a part of the side surface and the upper surface of the hydrogen blocking film 310.

Subsequently, processes of FIGS. 15, 16 and 1 may be performed.

Figure 18:
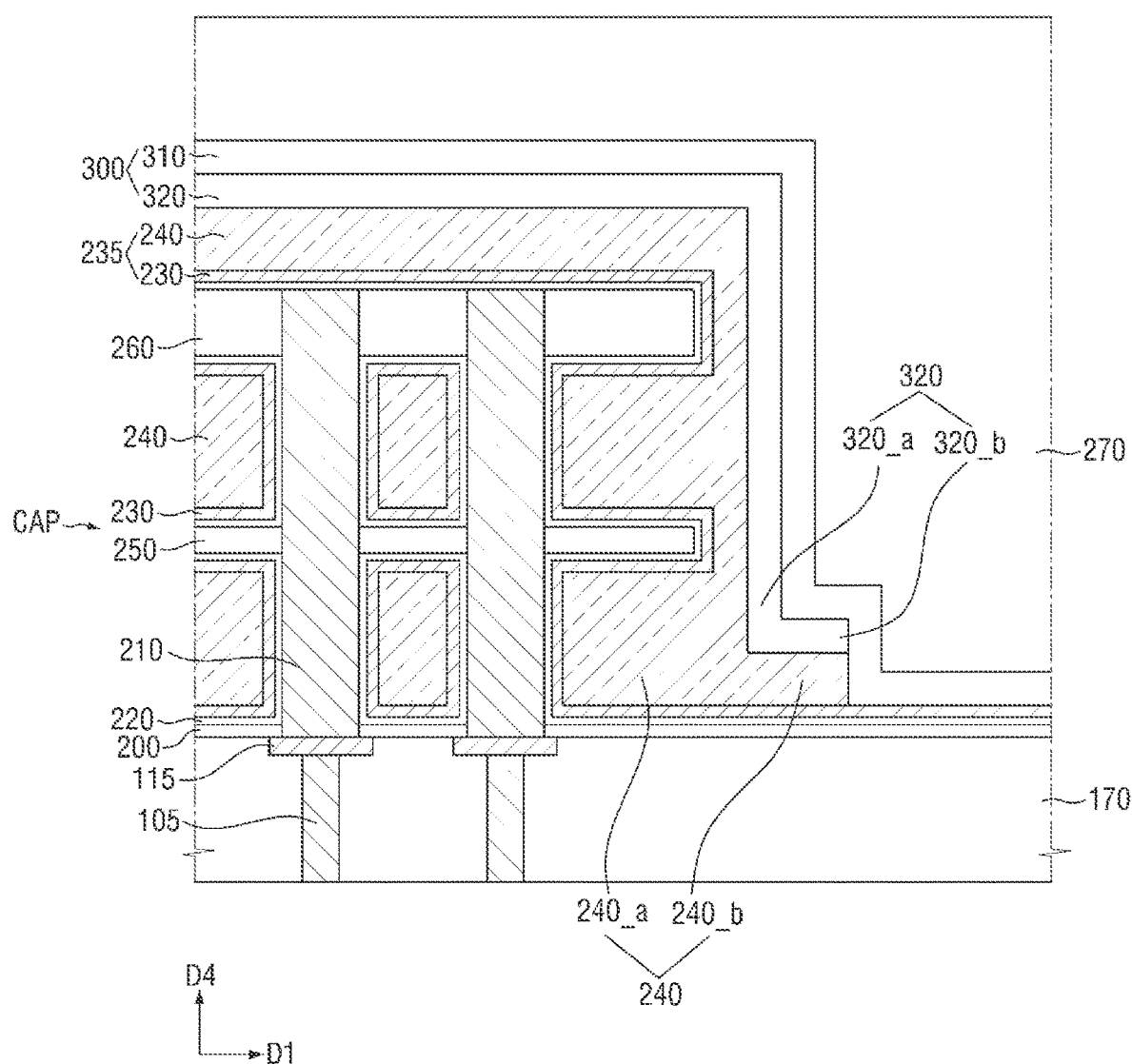
FIG. 18 is a diagram of a method for fabricating a semiconductor device according to some embodiments.

FIG. 18 is a diagram for explaining a method for fabricating a semiconductor device according to some embodiments. For convenience of explanation, differences from FIG. 15 will be mainly explained.

Referring to FIG. 18, the hydrogen bypass film 320 may be formed on the upper surface of the plate electrode 240. Next, some of the upper electrode 235 and the hydrogen bypass film 320 may be removed using a mask pattern. Accordingly, the first protrusion 240_b of the plate electrode 240 and the second protrusion 320_b of the hydrogen bypass film 320 may be formed. Further, the side surfaces of the upper electrode 235 and the hydrogen bypass film 320 may be on the same plane.

Subsequently, the mask pattern is removed, and a hydrogen blocking film 310 may be conformally formed on the hydrogen bypass film 320, the exposed upper electrode 235 and the capacitor dielectric film 220.

Subsequently, as described above in FIG. 16, the second interlayer insulating film 270 may be formed. Subsequently, referring to FIG. 12, a first contact plug 275, a third interlayer insulating film 370, a first wiring layer 375, a second wiring layer 475 and a passivation layer 400 may be formed.

While the present disclosure has been particularly shown and described with reference to the example embodiments thereof, it will be understood by those of ordinary skill in the art that various changes in form and detail may be made therein without departing from the spirit and scope of the present disclosure as defined by the following claims.

What is claimed is:

1. A semiconductor device comprising:
   a lower electrode on a substrate;
   a capacitor dielectric film extending on the lower electrode along a side surface of the lower electrode that is perpendicular to the substrate;
   an upper electrode on the capacitor dielectric film and on the lower electrode;
   an interface layer comprising a hydrogen blocking film and a hydrogen bypass film on the upper electrode, wherein the hydrogen bypass film comprises a conductive material;
   an interlayer insulating film on the interface layer; and
   a contact plug that penetrates the interlayer insulating film, the hydrogen blocking film and the hydrogen bypass film and is electrically connected to the upper electrode,
   wherein the hydrogen blocking film comprises an insulating material without silicon,
   wherein the hydrogen blocking film is between the upper electrode and the hydrogen bypass film,
   wherein the hydrogen bypass film extends along the hydrogen blocking film, and
   wherein the contact plug completely penetrates the hydrogen blocking film and contacts the upper electrode.

2. The semiconductor device of claim 1, wherein the insulating material comprises aluminum oxide.

3. The semiconductor device of claim 1, wherein the conductive material of the hydrogen bypass film comprises a metal material.

4. The semiconductor device of claim 3, wherein the metal material comprises at least one of tungsten, copper and/or aluminum.

5. The semiconductor device of claim 1, wherein the lower electrode extends longitudinally in a thickness direction of the substrate.

6. The semiconductor device of claim 1,
   wherein the upper electrode comprises a liner electrode extending along a surface of the capacitor dielectric film, and a plate electrode on the liner electrode, and
   wherein the contact plug is electrically connected to the plate electrode.

7. The semiconductor device of claim 6, wherein the plate electrode comprises a first body, and a first protrusion protruding from a lower part of the first body.

8. The semiconductor device of claim 1, wherein the interlayer insulating film comprises a first interlayer insulating film, the semiconductor device further comprising:
   a second interlayer insulating film on the first interlayer insulating film and comprising a first wiring layer electrically connected to the contact plug; and
   a passivation layer on the second interlayer insulating film,
   wherein a hydrogen concentration of the passivation layer is greater than a hydrogen concentration of the first interlayer insulating film and/or a hydrogen concentration of the second interlayer insulating film.

9. The semiconductor device of claim 1, wherein a side surface of the upper electrode and a side surface of the interface layer are coplanar.

10. A semiconductor device comprising:
    a substrate comprising a cell region and a cell peripheral region;
    a lower electrode on the cell region;
    a capacitor dielectric film extending on the lower electrode along a side surface of the lower electrode that is perpendicular to the substrate;
    an upper electrode on the capacitor dielectric film;
    an interface layer comprising a hydrogen blocking film and a hydrogen bypass film on the upper electrode;
    a first interlayer insulating film on the interface layer; and
    a contact plug that penetrates the first interlayer insulating film, the hydrogen blocking film, and the hydrogen bypass film and is electrically connected to the upper electrode,
    wherein the hydrogen bypass film is on the cell region and not on the cell peripheral region of the substrate,
    wherein the hydrogen blocking film is between the upper electrode and the hydrogen bypass film,
    wherein the hydrogen bypass film extends along the hydrogen blocking film, and
    wherein the contact plug completely penetrates the hydrogen blocking film and contacts the upper electrode.

11. The semiconductor device of claim 10, wherein a hydrogen diffusivity of the hydrogen bypass film is greater than a hydrogen diffusivity of the hydrogen blocking film.

12. The semiconductor device of claim 10,
    wherein the upper electrode comprises a first body, and a first protrusion protruding from a lower part of the first body, and
    wherein a side surface of the interface layer is coplanar with a side surface of the first protrusion.

13. The semiconductor device of claim 12,
    wherein the hydrogen blocking film comprises a second body extending along an upper surface and a side surface of the upper electrode, and a second protrusion protruding from a lower part of the second body,
    wherein the hydrogen bypass film comprises a third body extending along an upper surface and a side surface of the hydrogen blocking film,
    wherein the second protrusion is on the first protrusion, and
    wherein a side surface of the third body is coplanar with a side surface of the second protrusion.

14. A semiconductor device comprising:
    a gate trench in a substrate;
    a gate electrode in a portion of the gate trench;
    a storage contact on at least one side of the gate electrode and contacting the substrate;
    a storage pad on the storage contact;
    a capacitor electrically connected to the storage pad;
    an interface layer comprising a hydrogen blocking film and a hydrogen bypass film on the capacitor;
    a first interlayer insulating film on the interface layer; and a contact plug that penetrates the first interlayer insulating film, the hydrogen blocking film and the hydrogen bypass film and is electrically connected to the capacitor, wherein the hydrogen blocking film is in contact with an upper electrode of the semiconductor device and comprises an insulating material, and the hydrogen bypass film comprises a metal material, wherein the hydrogen blocking film is between the upper electrode and the hydrogen bypass film, wherein the hydrogen bypass film extends along the hydrogen blocking film, and wherein the contact plug completely penetrates the hydrogen blocking film.

15. The semiconductor device of claim 14, wherein a hydrogen diffusivity of the hydrogen bypass film is greater than a hydrogen diffusivity of the hydrogen blocking film, and wherein the hydrogen diffusivity of the hydrogen blocking film that is less than the hydrogen diffusivity of the hydrogen bypass film reduces hydrogen supply to the capacitor compared to other portions of the semiconductor device.

\* \* \* \* \*